United States Patent
Horsky

(10) Patent No.: US 7,838,842 B2
(45) Date of Patent: *Nov. 23, 2010

(54) DUAL MODE ION SOURCE FOR ION IMPLANTATION

(75) Inventor: Thomas N. Horsky, Boxborough, MA (US)

(73) Assignee: Semequip, Inc., North Billerica, MA (US)

( * ) Notice: Subject to any disclaimer, the term of this patent is extended or adjusted under 35 U.S.C. 154(b) by 128 days.

This patent is subject to a terminal disclaimer.

(21) Appl. No.: 11/268,005

(22) Filed: Nov. 7, 2005

(65) Prior Publication Data

US 2006/0097645 A1    May 11, 2006

Related U.S. Application Data

(63) Continuation-in-part of application No. 10/170,512, filed on Jun. 12, 2002, now Pat. No. 7,107,929, which is a continuation of application No. PCT/US00/33786, filed on Dec. 13, 2000.

(60) Provisional application No. 60/170,473, filed on Dec. 13, 1999, provisional application No. 60/250,080, filed on Nov. 30, 2000.

(51) Int. Cl.
*H01J 27/00* (2006.01)
*H05B 31/26* (2006.01)

(52) U.S. Cl. .............................. 250/423 R; 315/111.81

(58) Field of Classification Search ............ 315/111.81, 315/111.91, 111.21; 118/723 CB, 723 EB, 118/723 FI; 250/374, 377, 378, 379, 380, 250/381, 382, 385.2, 389, 423 R, 423 F, 425, 250/427

See application file for complete search history.

(56) References Cited

U.S. PATENT DOCUMENTS

| 2,754,422 | A |   | 7/1956 | Lofgren et al. |
| 4,017,403 | A |   | 4/1977 | Freeman |
| 4,135,093 | A | * | 1/1979 | Kim .................. 250/423 R |
| 4,258,266 | A |   | 3/1981 | Robinson et al. |
| 4,579,144 | A |   | 4/1986 | Lin et al. |
| 4,845,366 | A |   | 7/1989 | Hoffman et al. |
| 4,985,657 | A | * | 1/1991 | Campbell ................ 313/362.1 |
| 5,306,921 | A | * | 4/1994 | Tanaka et al. ........... 250/492.21 |
| 5,306,922 | A | * | 4/1994 | O'Connor .............. 250/492.21 |
| 5,497,006 | A |   | 3/1996 | Sferlazzo et al. |

(Continued)

OTHER PUBLICATIONS

U.S. Appl. No. 11/648,378, filed Dec. 29, 2006, SemEquip.
U.S. Appl. No. 11/648,366, filed Dec. 29, 2006, SemEquip.
U.S. Appl. No. 11/527,994, filed Sep. 26, 2006, SemEquip.
Shen et al., J. Chem. Phys. 101 (3), pp. 2261-2266, Aug. 1, 1994.
Greenwood et al., Chemistry of the Elements, 2nd Ed, 2001, Ch. 12, p. 479. Bunerworth-Heimann Publishers, Oxford, England.

(Continued)

*Primary Examiner*—Douglas W Owens
*Assistant Examiner*—Minh D A
(74) *Attorney, Agent, or Firm*—John S. Paniaguas; Katten Muchin Rosenman LLP

(57) ABSTRACT

An ion source is disclosed for providing a range of ion beams consisting of either ionized clusters, such as $B_2H_x^+$, $B_5H_x^+$, $B_{10}H_x^+$, $B_{18}H_x^+$, $P_4^+$ or $As_4^+$, or monomer ions, such as $Ge^+$, $In^+$, $Sb^+$, $B^+$, $As^+$, and $P^+$, to enable cluster implants and monomers implants into silicon substrates for the purpose of manufacturing CMOS devices, and to do so with high productivity. The range of ion beams is generated by a universal ion source in accordance with the present invention which is configured to operate in two discrete modes: an electron impact mode, which efficiently produces ionized clusters, and an arc discharge mode, which efficiently produces monomer ions.

22 Claims, 30 Drawing Sheets

U.S. PATENT DOCUMENTS

| | | | |
|---|---|---|---|
| 5,523,652 A * | 6/1996 | Sferlazzo et al. | 315/111.41 |
| 5,576,600 A * | 11/1996 | McCrary et al. | 315/111.81 |
| 5,607,509 A | 3/1997 | Schumacher et al. | |
| 5,633,506 A | 5/1997 | Blake | |
| 5,703,372 A | 12/1997 | Horsky et al. | |
| 5,780,862 A | 7/1998 | Siess | |
| 5,904,567 A | 5/1999 | Yamazaki | |
| 5,939,831 A | 8/1999 | Fong et al. | |
| 6,046,546 A | 4/2000 | Porter et al. | |
| 6,205,948 B1 | 3/2001 | Guenzel | |
| 6,259,091 B1 | 7/2001 | Eiden et al. | |
| 6,288,403 B1 | 9/2001 | Horsky et al. | |
| 6,358,431 B1 | 3/2002 | Stirling et al. | |
| 6,452,338 B1 | 9/2002 | Horsky et al. | |
| 6,479,785 B1 | 11/2002 | Fugo et al. | |
| 6,686,595 B2 | 2/2004 | Horsky | |
| 6,744,214 B2 * | 6/2004 | Horsky | 315/111.81 |
| 6,777,686 B2 | 8/2004 | Olson et al. | |
| 6,805,779 B2 | 10/2004 | Chistyakov | |
| 6,975,073 B2 | 12/2005 | Wakalopulos | |
| 7,022,999 B2 | 4/2006 | Horsky et al. | |
| 7,107,929 B2 | 9/2006 | Horsky et al. | |
| 7,112,804 B2 * | 9/2006 | Horsky et al. | 250/423 R |
| 7,185,602 B2 | 3/2007 | Horsky et al. | |
| 2003/0079688 A1 * | 5/2003 | Walther et al. | 118/723 FI |
| 2003/0197129 A1 | 10/2003 | Murrell et al. | |
| 2004/0000647 A1 | 1/2004 | Horsky | |
| 2004/0002202 A1 | 1/2004 | Horsky et al. | |
| 2004/0097193 A1 | 5/2004 | Horsky et al. | |
| 2005/0269520 A1 | 12/2005 | Horsky et al. | |
| 2006/0097645 A1 | 5/2006 | Horsky | |
| 2008/0087219 A1 * | 4/2008 | Horsky | 118/698 |

OTHER PUBLICATIONS

Greenwood et al., Chemistry of the Elements, $2^{nd}$ Ed., 2001, Ch. 13, p. 551, Bunerworth-Heiemann Publishers, Oxford, England.

Honig et al, RCA Review, 30, p. 285, Jun. 1969.

U.S. Appl. No. 11/940,126, filed Nov. 14, 2007 Horsky et al.

International Search Report from PCT/US06/4318, mailed Feb. 28, 2007.

* cited by examiner

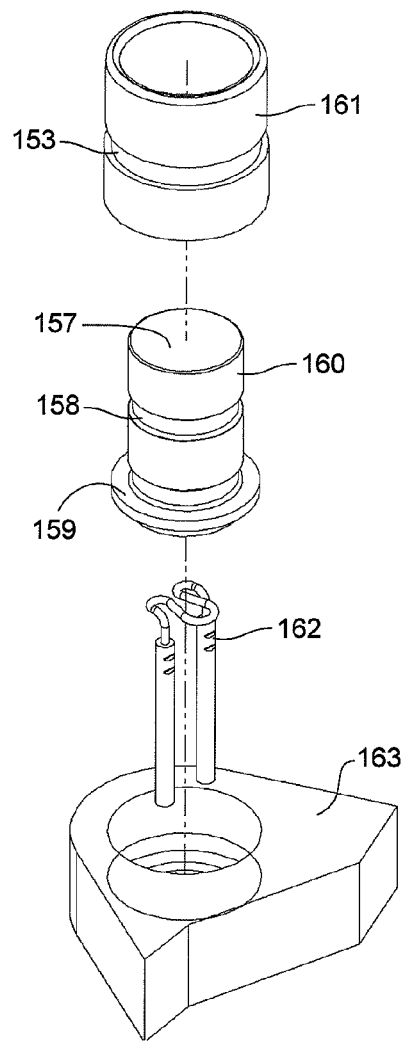
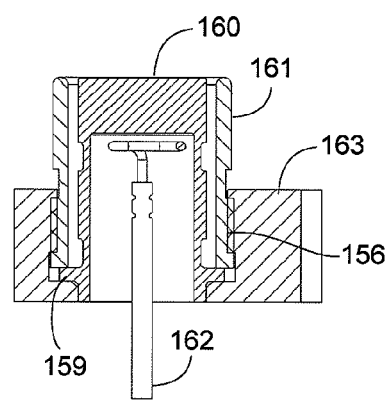
Fig. 5C
Fig. 5B

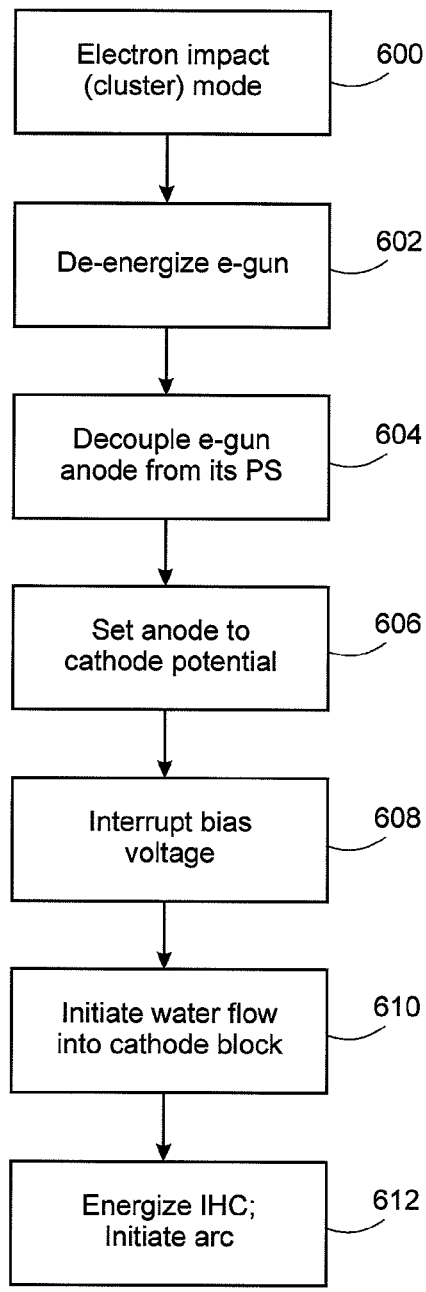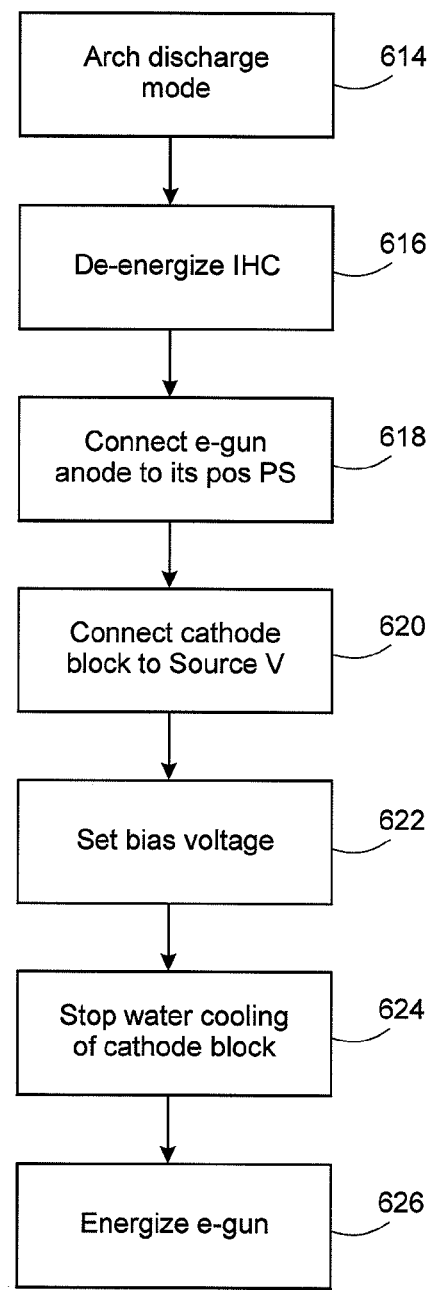
Fig. 12A
Fig. 12B y-z Section x-y Section x-z Section

DUAL MODE ION SOURCE FOR ION IMPLANTATION

CROSS-REFERENCE TO RELATED APPLICATIONS

This application is a continuation-in-part of U.S. patent application Ser. No. 10/170,512, filed on Jun. 12, 2002, now U.S. Pat. No. 7,107,929, issued on Sep. 19, 2006, which is a continuation of International Patent Application No. PCT/US00/33786, filed on Dec. 13, 2000 which, in turn, claims the benefit of and the priority to U.S. Provisional Patent Application No. 60/170,473, filed on Dec. 13, 1999 and U.S. Provisional Application No. 60/250,080, filed on Nov. 30, 2000.

BACKGROUND OF THE INVENTION

1. Field of the Invention

The present invention relates to an ion source for the generation of ion beams for doping wafers in the semiconductor manufacturing of PMOS and NMOS transistor structures to make integrated circuits and more particularly to a universal ion source configured to operate in dual modes, for example, an arc discharge mode and an electron impact mode.

2. Description of the Prior Art

The Ion Implantation Process

The fabrication of semiconductor devices involves, in part, the formation of transistor structures within a silicon substrate by ion implantation. The ion implantation equipment includes an ion source which creates a stream of ions containing a desired dopant species, a beam line which accelerates and focuses the ion stream into an ion beam having a well-defined energy or velocity, an ion filtration system which selects the ion of interest, since there may be different species of ions present within the ion beam, and a process chamber which houses the silicon substrate upon which the ion beam impinges; the ion beam penetrating a well-defined distance into the substrate. Transistor structures are created by passing the ion beam through a mask formed directly on the substrate surface, the mask being configured so that only discrete portions of the substrate are exposed to the ion beam. Where dopant ions penetrate into the silicon substrate, the substrate's electrical characteristics are locally modified, creating source, drain and gate structures by the introduction of electrical carriers: such as, holes by p-type dopants, such as boron or indium, and electrons by n-type dopants, such as phosphorus or arsenic, for example.

Prior Art Ion Sources

Traditionally, Bernas-type ion sources have been used in ion implantation equipment. Such ion sources are known to break down dopant-bearing feed gases, such as $BF_3$, $AsH_3$ or $PH_3$, for example, into their atomic or monomer constituents, producing the following ions in copious amounts: $B^+$, $As^+$ and $P^+$. Such ion sources are known to produce extracted ion currents of up to 50 mA, enabling up to 20 mA of filtered ion beam at the silicon substrate. Bernas type ion sources are known as hot plasma or arc discharge type sources and typically incorporate an electron emitter, either a naked filament cathode or an indirectly-heated cathode, and an electron repeller, or anticathode, mounted opposed to one another in a so-called "reflex" geometry. This type of source generates a plasma that is confined by a magnetic field.

Recently, cluster implantation sources have been introduced into the equipment market. These ion sources are unlike the Bernas-style sources in that they have been designed to produce "clusters", or conglomerates of dopant atoms in molecular form, e.g., ions of the form $As_n^+$, $P_n^+$, or $B_nH_m^+$, where n and m are integers, and $2 \leq n \leq 18$. Such ionized clusters can be implanted much closer to the surface of the silicon substrate and at higher doses relative to their monomer (n=1) counterparts, and are therefore of great interest for forming ultra-shallow p-n transistor junctions, for example in transistor devices with gate lengths of 65 nm, 45 nm, or 32 nm. These cluster sources preserve the parent molecules of the feed gases and vapors introduced into the ion source. The most successful of these have used electron-impact ionization, and do not produce dense plasmas, but rather generate low ion densities at least 100 times smaller than produced by conventional Bernas sources.

SUMMARY OF THE INVENTION

Briefly, the present invention relates to an ion source for providing a range of ion beams consisting of either ionized clusters, such as $B_2H_x^+$, $B_5H_x^+$, $B_{10}H_x^+$, $B_{18}H_x^+$, $P_4^+$ or $As_4^+$, or monomer ions, such as $Ge^+$, $In^+$, $Sb^+$, $B^+$, $As^+$, and $P^+$, to enable cluster implants and monomer implants into silicon substrates for the purpose of manufacturing CMOS devices, and to do so with high productivity. This is accomplished by the novel design of an ion source which can operate in two discrete modes: electron impact mode, which efficiently produces ionized clusters, or arc discharge mode, which efficiently produces monomer ions.

Borohydride molecular ions are created by introducing gaseous $B_2H_6$, $B_5H_9$, $B_{10}H_{14}$, or $B_{18}H_{22}$ into the ion source where they are ionized through a "soft" ionization process, such as electron impact ionization, which preserves the number of boron atoms in the parent molecule (the number of hydrogens left attached to the ion may be different from that of the parent). Likewise, As vapor or P vapor can be introduced into the ion source (from a vaporizer which sublimates elemental As or P) to produce an abundance of $As_4^+$, $As_2^+$, and $As^+$, or $P_4^+$, $P_2^+$, and $P^+$ ions. The mechanism for producing As and P clusters from elemental vapor will be described in more detail below. Monomer ions are produced by creating an arc discharge within the ion source, producing a dense plasma and breaking down the feed gases $BF_3$, $AsH_3$, $PH_3$, $SbF_5$, $InCl_3$, $InF_3$ and $GeF_4$ into their constituent atoms. This provides high currents of $Ge^+$, $In^+$, $Sb^+$, $B^+$, $As^+$, and $P^+$ ions as required by many semiconductor processes today. The invention, as described in detail below, is disclosed by novel methods of constructing and operating a single or universal ion source which produces these very different ion species, i.e., both clusters and monomers, and switching between its two modes of operation quickly and easily, enabling its efficient use in semiconductor manufacturing.

Production of Clusters of Arsenic and Phosphorus

An object of this invention is to provide a method of manufacturing a semiconductor device, this method being capable of forming ultra-shallow impurity-doped regions of N-type conductivity in a semiconductor substrate by implanting ionized clusters of the form $P_4^+$ and $As_4^+$.

A further object of this invention is to provide for an ion implantation source and system for manufacturing semiconductor devices, which has been designed to form ultra shallow impurity-doped regions of N-conductivity type in a semiconductor substrate through the use of cluster ions of the form $P_4^+$ and $As_4^+$.

According to one aspect of this invention, there is provided a method of implanting cluster ions comprising the steps of: providing a supply of molecules each of which contains a plurality of either As or P dopant atoms into an ionization volume, ionizing the molecules into dopant cluster ions, extracting and accelerating the dopant cluster ions with an electric field, selecting the desired cluster ions by mass analysis, and implanting the dopant cluster ions into a semiconductor substrate.

Economic Benefits of As and P Clusters

While the implantation of P-type clusters of boron hydrides for semiconductor manufacturing has been demonstrated, no N-type cluster has been documented which produces large ionized clusters in copious amounts. If ions of the form $P_n^+$ and $As_n^+$ with n=4 (or greater) could be produced in currents of at least 1 mA, then ultra-low energy, high dose implants of both N- and P-type conductivity would be enabled. Since both conductivity types are required by CMOS processing, such a discovery would enable clusters to be used for all low energy, high dose implants, resulting in a dramatic increase in productivity, with a concomitant reduction in cost. Not only would cost per wafer decline dramatically, but fewer ion implanters would be required to process them, saving floor space and capital investment.

Process Benefits of As and P Clusters

The preferred method of forming drain extensions for sub-65 nm devices is expected to incorporate a wafer tilt $\geq$30 deg from the substrate normal, in order to produce enough "under the gate" dopant concentration, without relying on excessive dopant diffusion brought about by aggressive thermal activation techniques. Excellent beam angular definition and low beam angular divergence are also desired for these implants; while high current implanters tend to have large angular acceptances and significant beam non-uniformities, medium current implanters meet these high-tilt and precise angle control requirements. Since medium-current implanters do not deliver high enough currents, their throughput on high-dose implants is too low for production. If ion implanters could produce the required low-energy beams at high dose rates, great economic advantage would be achieved. Since drain extensions are the shallowest of implants, they are also at the lowest energies (about 3 keV As at the 65 nm node, for example); the long, complicated beamlines which typify medium-current implanters cannot produce enough current at low energy to be useful in manufacturing such devices. The use of $As_4^+$ and $P_4^+$ cluster implantation in medium-current beam lines and other scanned, single-wafer implanters extends the useful process range of these implanters to low energy and to high dose. By using high currents of these clusters, up to a factor of 16 in throughput increase can be realized for low-energy, high dose ($\geq 10^{14}/cm^2$) implants with effective As and P implant energies as low as 1 keV per atom.

The Chemical Nature of Arsenic and Phosphorus

As is generally known, elemental, solid As and P are known to exist in a tetrahedral form (i.e., as white phosphorus, $P_4$, and as yellow arsenic, $As_4$). They would therefore seem to be ideal candidates for producing tetramer ions in an ion source. However, while these compounds can be synthesized, they are more reactive, and hence more unstable, than their more common forms, i.e., red P and grey As metals. These latter forms are easily manufactured, stable in air, and inexpensive. Importantly, it turns out that when common red P and grey As are vaporized, they naturally form primarily $P_4$ and $As_4$ clusters in the vapor phase! [see, for example, M. Shen and H. F. Schaefer III, J. Chem. Phys. 101 (3) pp. 2261-2266, 1 Aug. 1994.; *Chemistry of the Elements.* 2$^{nd}$ *Ed.*, N. N Greenwood and A. Earnshaw, Eds., Butterworth-Heiemann Publishers, Oxford, England, 2001, Chap. 13, p. 55; R. E. Honig and D. A. Kramer, *RCA Review* 30, p. 285, June 1969.] Electron diffraction studies have confirmed that in the vapor phase the tetrahedral $As_4$ predominates. This tetrahedral phase is delicate, however, and is readily dissociated, for example, by exposure to ultraviolet light or x-rays, and dissociates in plasmas of the type formed by conventional ion sources. Indeed, it is known that $As_4$ quite readily dissociates into $2As_2$ under energetic light bombardment.

Significant currents of ionized $As_4$ and $P_4$ clusters can be produced by vaporizing solid forms of As and P (either the amorphous or tetrahedral solid phases) and preserving these clusters through ionization in a novel electron-impact ionization source, demonstrating that the clusters survive electron impact.

Although prior art ion sources have used vaporized solid As and P to generate ion beams, the tetramers have not been preserved. The ions produced by these arc discharge sources have consisted of principally monomers and dimers. Since the tetramer forms $As_4$ and $P_4$ are delicate and easily dissociated by the introduction of energy, to preserve them, the source should be free from excessive UV (such as emitted by hot filaments, for example) and most importantly, be ionized by a "soft" ionization technique, such as electron impact. As will be discussed in more detail below, this technique is useful in creating $As_4^+$ ions from vaporized elemental arsenic and phosphorus.

Advantages of the Novel Ion Source for $As_4$ and $P_4$ Production

The ion source of the present invention introduces gaseous $As_4$ and $P_4$ vapors through a vaporizer, which heats solid feed materials, such as elemental As or P, and conducts the vapor through a vapor conduit into the ionization chamber of the ion source. Once introduced into the ionization chamber of the ion source, the vapor or gas interacts with an electron beam which passes into the ionization volume from an external electron gun, forming ions. The vapor is not exposed to a hot, UV-producing cathode since the electron gun is external to the ionization volume and has no line-of-sight to the vapors. The ions are then extracted from a rectangular aperture in the front of the ionization volume by electrostatic optics, forming an ion beam.

DESCRIPTION OF THE DRAWINGS

These and other advantages of the present invention will be readily understood with reference to the following specification and attached drawing wherein:

FIG. 5b is an enlarged exploded view of a portion of the IHC assembly, illustrating the IHC, a filament, a cathode sleeve, and a portion of a cathode plate.

FIG. 5c is an elevational view in cross section of the IHC assembly illustrated in FIG. 5b.

FIGS. 12a and 12b are logic flow diagrams illustrating the sequence of steps required to establish each operating mode in succession.

DETAILED DESCRIPTION

The present invention relates to ion source for providing a range of ion beams consisting of either ionized clusters, such as $B_2H_x^+$, $B_5H_x^+$, $B_{10}H_x^+$, $B_{18}H_x^+$, $P_4^+$ or $As_4^+$ or monomer ions, such as $Ge^+$, $In^+$, $Sb^+$, $B^+$, $As^+$, and $P^+$, to enable cluster implants and monomer implants into silicon substrates for the purpose of manufacturing CMOS devices, and to do so with high productivity. The range of ion beams is generated by a universal ion source in accordance with the present invention which is configured to operate in two discrete modes: an electron impact mode, which efficiently produces ionized clusters, and an arc discharge mode, which efficiently produces monomer ions.

Figure 14:
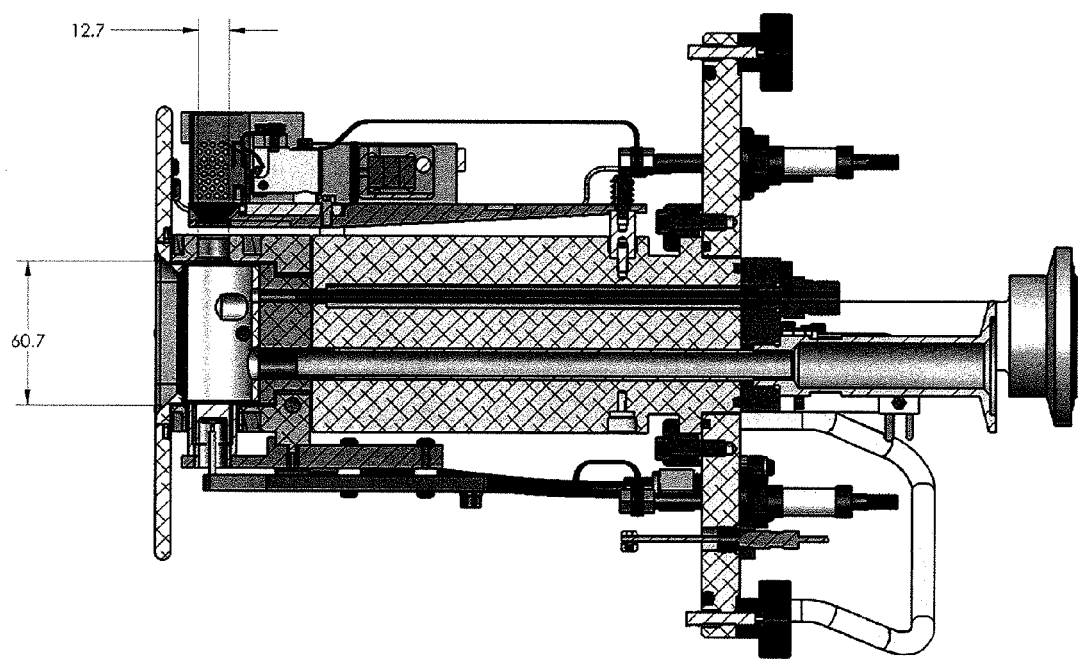
FIG. 14 is a side view in cross section, of the source assembly, cut in the y-z plane.
Figure 15:
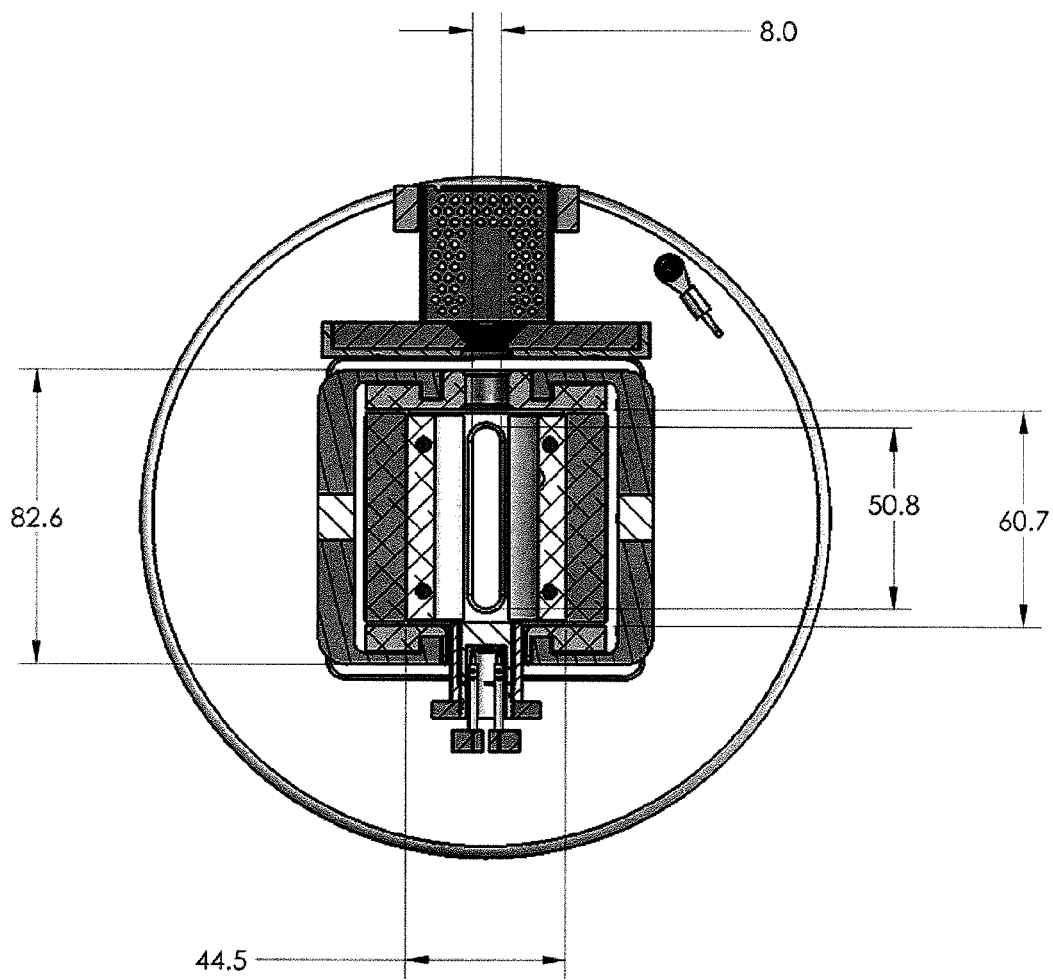
FIG. 15 is similar to FIG. 14 but cut in the x-y plane.
Figure 16:
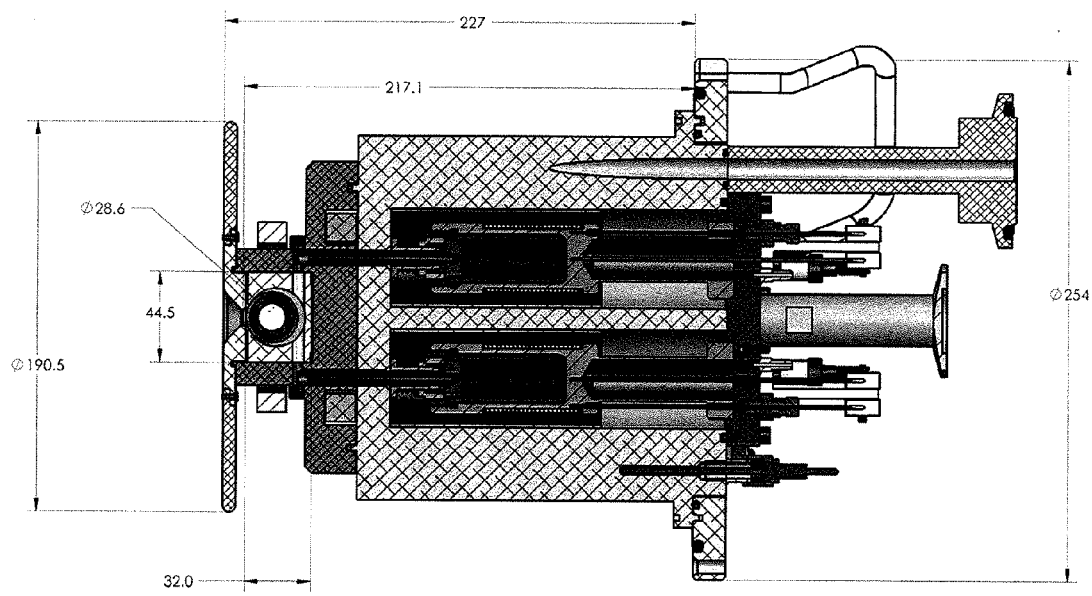
FIG. 16 is similar to FIG. 14 but cut in the x-z plane.
Figure 17:
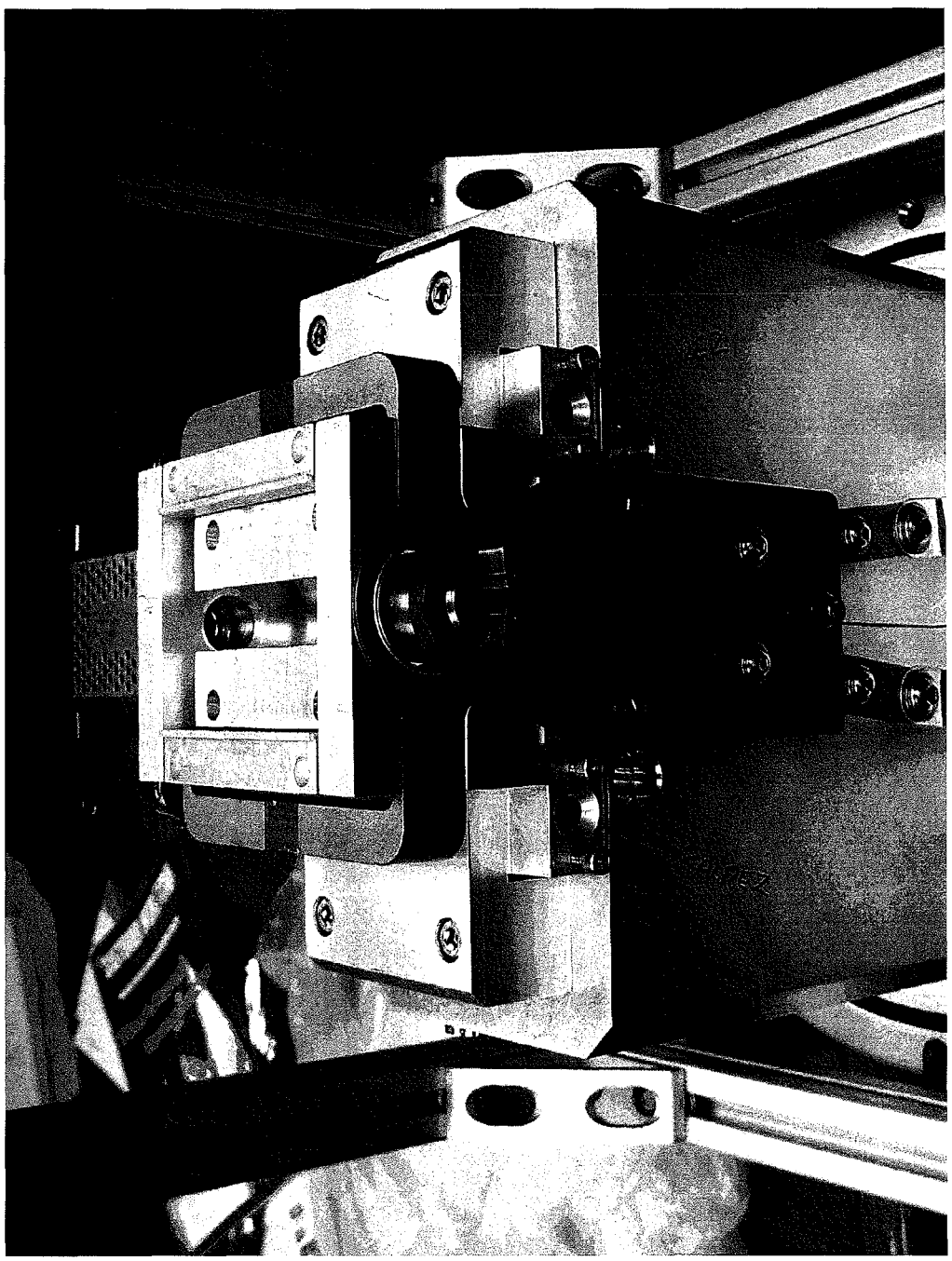
FIG. 17 is a photograph of the source with the front aperture plate removed, showing the indirectly heated cathode and the ionization volume liner.
Figure 18:
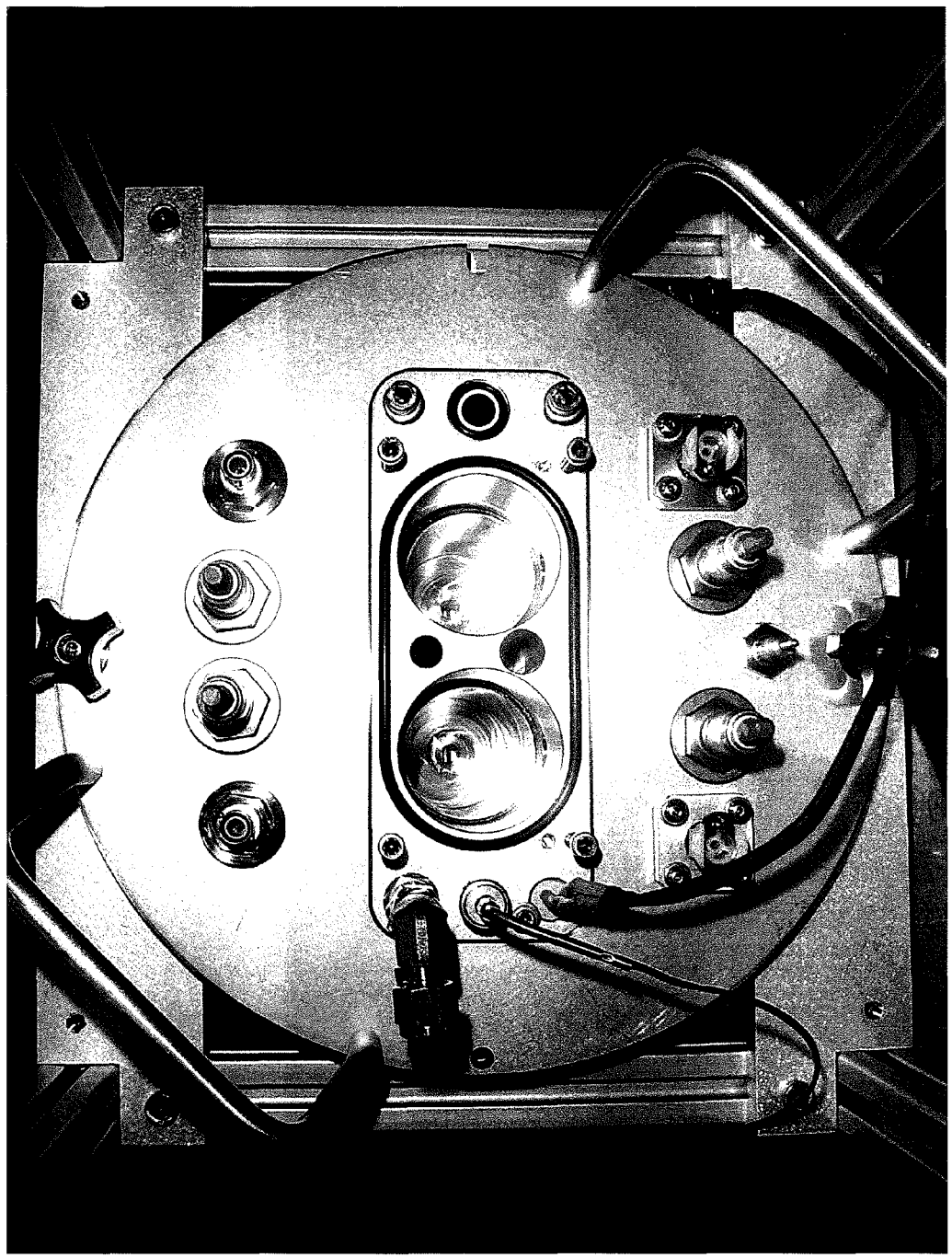
FIG. 18 is a photograph showing the mounting flange with feedthroughs, shown with the vaporizers removed.

The universal ion source in accordance with the present invention is illustrated and described below. FIG. 14 shows, in cross section, a cut in the y-z plane (i.e., side view) through the ion source assembly in accordance with the present invention. FIG. 15 is similar to FIG. 14, but shows, in cross section, a cut in the x-y plane through the source assembly. FIG. 16 shows, in cross section, a cut in the x-z plane through the source assembly. FIG. 17 is a photograph of the source with the front aperture plate removed, showing the indirectly heated cathode and the ionization chamber liner. FIG. 18 is a photograph showing the mounting flange with feed throughs with the vaporizers removed.

In order to efficiently produce ionized clusters, the ion source of the present invention incorporates the following features:

An electron-impact ionization source is provided, for example an electron gun which is located external to the ionization volume and out of line-of-sight of any process gas or vapors exiting the ionization volume, and the vapors in the ionization chamber are likewise not exposed to electromagnetic radiation emitted by the hot cathode in the electron gun;

When operating in the electron-impact mode, the surfaces exposed to the vapor introduced into the source are held within a temperature range which is low enough to prevent dissociation of the temperature-sensitive parent molecule, and high enough to prevent or limit unwanted condensation of the vapors onto said surfaces;

Multiple vaporizers are provided which can produce a stable flow of vapor into the source (the vaporization temperatures of the solid borohydride materials $B_{10}H_{14}$ and $B_{18}H_{22}$ range from 20 C to 120 C, while solid elemental materials, such as As and P, require heating in the range between 400 C and 550 C to provide the required vapor flows. Thus, one or more "cold" vaporizers and one or more "hot" vaporizers are incorporated into the ion source.

In order to efficiently produce monomer ions, the ion source of the present invention also incorporates the following features:

An electron source (cathode), a repeller (anticathode) and a magnetic field are incorporated into the ion source in a "reflex" geometry, wherein a strong magnetic field is oriented substantially parallel to the ion extraction aperture of the ion source, along a line joining the electron source and repeller;

Electronics are provided so that an arc discharge can be sustained between the cathode and the anticathode, such that a plasma column is sustained along the magnetic field direction, i.e., parallel and in proximity to the ion extraction aperture;

An ionization volume liner (an "inner chamber") is provided within the ion source, enclosing the ionization volume, and is allowed to reach a temperature well in excess of 200 C during arc discharge operation in order to limit condensation of As, P and other species onto the walls surrounding the ionization volume;

A process gas feed is provided to supply conventional gaseous dopant sources into the ion source.

Other novel features are provided in the ion source to enable reliability and performance: It is a feature of the invention that the ion source incorporates an in-situ chemical cleaning process, preferably by the controlled introduction of atomic fluorine gas, and the materials used to construct the elements of the ion source are selected from materials resistant to attack by F:

The ionization chamber liner may be fabricated from titanium diboride ($TiB_2$), which is resistant to attack by halogen gases, and possesses good thermal and electrical conductivity, but may also be usefully fabricated of aluminum, graphite or other electrical and thermal conductor which is not readily attacked by flourine;

The arc discharge electron source may be an indirectly-heated cathode, and the portion of which exposed to the cleaning gas may be formed a thick tungsten, tantalum or molybdenum disk, and is therefore much more robust against failure in a halogen environment than a naked filament;

The indirectly-heated cathode assembly is mechanically mounted onto a water-cooled aluminum "cathode block" so that the, limiting its radiative heat load to the ionization chamber and liner (we note that aluminum passivates in a F environment, and is therefore resistant to chemical etch); this enables rapid cool down of the cathode between the time it is de-energized and the onset of an in-situ cleaning cycle, reducing the degree of chemical attack of the refractory metal cathode The electron gun which is energized during electron-impact ionization (i.e., during cluster beam formation) is remote from the ionization volume, mounted externally and has no line-of-sight to the F gas load during an in-situ clean, and therefore is robust against damage by F etching.

Other novel features are incorporated to improve source performance and reliability:

The aluminum cathode block or frame is at cathode potential, eliminating the risk of cathode voltage shorts which are known to occur between indirectly-heated cathodes and the source chambers of prior art sources. This block also conveniently forms the repeller structure, being at cathode potential, thereby obviating the need for a dedicated electron repeller or anticathode;

The ionization volume liner is surrounded by a cathode block and a base; the aluminum base and cathode block are held in thermal contact with a temperature-controlled source block through thermally conductive, but electrically insulating elastomeric gaskets. This feature limits the maximum temperature of the block and base to near the source block temperature (the source block is typically held below 200 C);

The ionization volume liner is in thermal contact with the base through a high-temperature, thermally and electrically conductive gasket, such as aluminum, to limit its maximum temperature excursion while insuring its temperature is higher than that of the cathode block and base; Unlike other known ion sources, no ionization chamber per se is provided.

The source magnetic field is provided by a magnetic yoke assembly which surrounds the ionization chamber assembly. It is embedded in the cathode block. This provides a means for keeping the yoke assembly at a temperature well below the Curie temperature of its permanent magnets.

The ion source operates in two discrete modes: electron impact mode and arc discharge mode. The operating conditions for each are quite different as described in detail below.

When operating in electron impact mode, the following conditions are met:

The source block is held at a temperature between about 100° C. and 200° C. Depending on which specie is run in the ion source; this provides a reference temperature for the source, preventing condensation of the source material, such as borohydride or other source materials;

The indirectly heated cathode is not energized, and cooling water is not run in the cathode block. The cathode block comes to thermal equilibrium with the base, with which it is in thermal contact through a thermally conductive, but electrically insulating, gasket (the base is in turn in good thermal contact with the source block, and so rests near the source block temperature);

The cathode block is held at the same potential as the base and the ionization volume liner;

The electron gun is energized by applying a negative potential to the electron emitter (i.e. the cathode), and applying a positive potential to the anode and the gun base (i.e. the potential of the local environment of the electron beam as it propagates through the gun). The cathode and anode voltages are measured with respect to the ionization volume. This enables a "deceleration" field to act on the electron beam as it propagates between the gun base and ionization volume so that the energy of the electrons which ionize the gas or vapor can be varied independently of the energy of the electron beam propagating within the gun, and in particular be reduced to effect more efficient ionization of the gas molecules;

A permanent magnetic field provides confinement of the electron beam as it enters and transits the ionization chamber, enabling a uniform ion density to be created adjacent to, and along the ion extraction aperture of the ion source;

The $TiB_2$ liner (which can also be made of SiC, $B_4C$, Al, C, or any other suitable electrically conductive material which is not a deleterious contaminant in silicon circuits) is in thermal contact with the base (which is in thermal continuity with the source block) through an electrically and thermally conductive high-temperature gasket, and so will settle close to the source block temperature, since very little power (typically <10 watts) is dissipated by the electron beam within the ionization volume The liner is thus always at the same potential as the ionization volume and the source block.

When operating in arc discharge mode, the following conditions are met:

The source block is held at between 100° C. and 200° C.

The indirectly heated cathode is energized, and cooling water is run in the cathode block. The cathode block temperature is thus maintained near to the water temperature, and cooler than the base, which is in thermal contact with the source block;

The cathode block is held at the same potential as the cathode, up to 100V negative with respect to the liner which surrounds the ionization volume. Since the cathode block also comprises the repeller or anticathode, it is also at cathode potential. In the presence of the permanent axial magnetic field, this enables a true "reflex" geometry and hence a stable plasma column. The arc current is absorbed by the liner, whose potential establishes the plasma potential.

The electron gun is not energized, the electron emitter is set to source block potential, and the gun base is set to cathode block potential. This prevents any net field from penetrating from the gun base through the electron entrance aperture in the cathode block.

With the indirectly-heated cathode energized and an arc discharge initiated, the liner is exposed to a significant radiative heat load. This allows the liner to reach an equilibrium temperature well in excess of the base. The maximum temperature differential can be "tuned" by reducing or increasing the thermal contact between liner and base.

Figure 1:
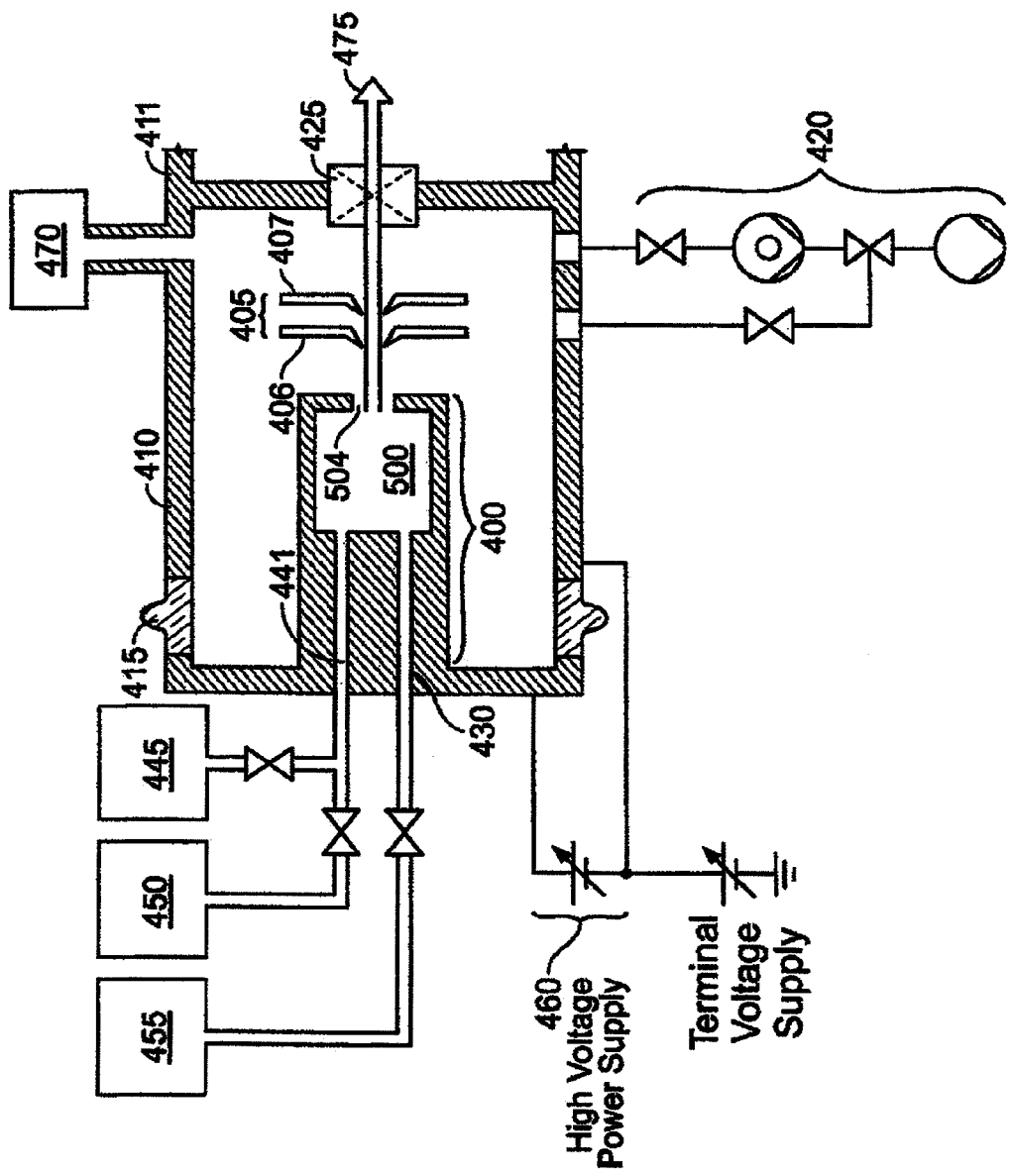
FIG. 1 is a schematic diagram of an exemplary ion beam generation system in accordance with the present invention.

Referring to FIG. 1, a schematic diagram of an exemplary ion beam generation system which incorporates an ion source in accordance with the present invention is illustrated. As shown in this example, the ion source 400 is adapted to produce an ion beam for transport to an ion implantation chamber for implant into semiconductor wafers or flat-panel displays. The ion beam generation system includes an ion source 400, an extraction electrode 405, a vacuum housing 410, a voltage isolation bushing 415 of electrically insulative material, a vacuum pumping system 420, a vacuum housing isolation valve 425, a reactive gas inlet 430, a feed gas and vapor inlet 441, a vapor source 445, a feed gas source 450, a reactive gas source 455, an ion source high voltage power supply 460 and an ion beam transport housing 411. The ion source 400 produces a resultant ion beam illustrated by the arrow 475.

The ion source 400 is constructed to provide cluster ions and molecular ions, for example the borohydride ions $B_{10}H_x^+$, $B_{10}H_x^-$, $B_{18}H_x^+$, and $B_{18}H_x^-$ or, and alternatively, more conventional ion beams, such as $P^+$, $As^+$, $B^+$, $In^+$, $Sb^+$, $Si^+$, and Ge. The gas and vapor inlet 441 for gaseous feed material to be ionized is connected to a suitable vapor source 445, which may be in close proximity to gas and vapor inlet 441 or may be located in a more remote location, such as in a gas distribution box, located elsewhere within a terminal enclosure.

A terminal enclosure is a metal box, not shown, which encloses the ion beam generating system. It contains required facilities for the ion source, such as pumping systems, power distribution, gas distribution, and controls. When mass analysis is employed for selection of an ion species in the beam, the mass analyzing system may also be located in the terminal enclosure.

In order to extract ions of a well-defined energy, the ion source 400 is held at a high positive voltage (in the more common case where a positively-charged ion beam is generated) with respect to an extraction electrode assembly 405 and a vacuum housing 410 by a high voltage power supply 460. The extraction electrode assembly 405 is disposed close to and aligned with an extraction aperture 504 on an extraction aperture plate which forms a portion of the ionization volume 500. The extraction electrode assembly consists of at least two aperture-containing electrode plates, a so-called suppression electrode 406 closest to the ionization volume 500, and a "ground" electrode 407. The suppression electrode 406 is biased negative with respect to a ground electrode 407 to reject or suppress unwanted electrons which are attracted to the positively-biased ion source 400 when generating positively-charged ion beams. The ground electrode 407, vacuum housing 410, and terminal enclosure (not shown) are all at the so-called terminal potential, which is at earth ground unless it is desirable to float the entire terminal above ground, as is the case for certain implantation systems, for example for medium-current ion implanters. The extraction electrode 405 may be of the novel temperature-controlled metallic design, described below.

In accordance with another aspect of the invention, the ion source 400, illustrated in of FIG. 1, may be configured for in situ cleaning, i.e. without the ion source being removed from its operating position in the vacuum housing, and with little interruption of service. Indeed, for ion sources suitable for use with ion implantation systems, e.g. for doping semiconductor wafers, the source chamber or ionization volume 500 is small, having a volume, for example, less than about 100 ml, and an internal surface area of, for example, less than about 200 cm$^2$, and is constructed to receive a flow of the reactive gas, e.g. atomic fluorine or a reactive fluorine-containing compound at a flow rate of less than about 200 Standard Liters Per Minute. As such, a dedicated endpoint detector 470, in communication with the vacuum housing 410 may be used to monitor the reactive gas products during chemical cleaning.

Figure 2:
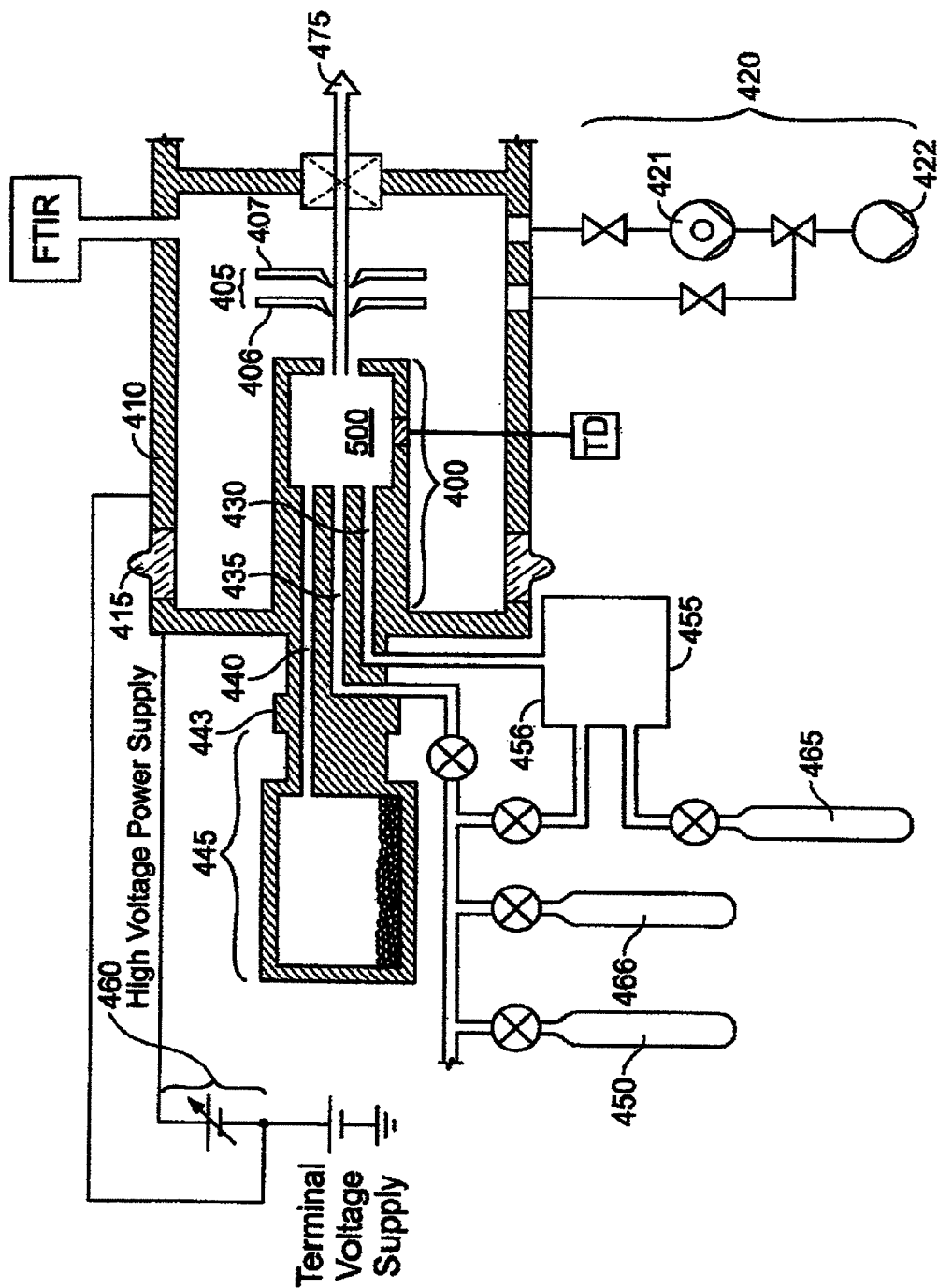
FIG. 2 is a schematic diagram of an alternative embodiment of the exemplary ion beam generation system illustrated in FIG. 1, illustrating a solid vapor source and an in-situ cleaning system.

FIG. 2 illustrates an embodiment of an ion source, similar to FIG. 1, that is configured for conducting in-situ chemical cleaning of the ion source 400 including the extraction electrode assembly 405. The in situ cleaning system is described in detail in International Patent Application No. PCT/US2004/041525, filed on Dec. 9, 2004, hereby incorporated by reference. Briefly, three inlet passages are integrated into ion source 400, respectively. One inlet passage is for reactive gas 430 from a plasma source 455. Another inlet passage is for feed gas 435 from one of a number of storage volumes 450 selected. The third inlet is for feed vapor 440 from a vaporizer 445. The plasma-based reactive gas source 455 is biased at the high voltage of the ion source 400. This enables the remote plasma source 455 to share control points of the ion source 400 and also enables the cleaning feed gas 465 and argon purge gas from storage source 466 to be supplied from an ion source gas distribution box, which is at source potential. Also shown is a different type of endpoint detector, namely a Fourier Transform Infrared (FTIR) optical spectrometer. This detector can function ex-situ (outside of the vacuum housing), through a quartz window. Instead, as shown in FIG. 2, an extractive type of FTIR spectrometer may be used, which directly samples the gas in the vacuum housing 410 during cleaning. Also a temperature sensor TD may sense the temperature of the de-energized ionization chamber by sensing a thermally isolated, representative region of the surface of the chamber. The sensor TD can monitor heat produced by the exothermic reaction of F with the contaminating deposit, to serve as end-point detection.

Figure 3A:
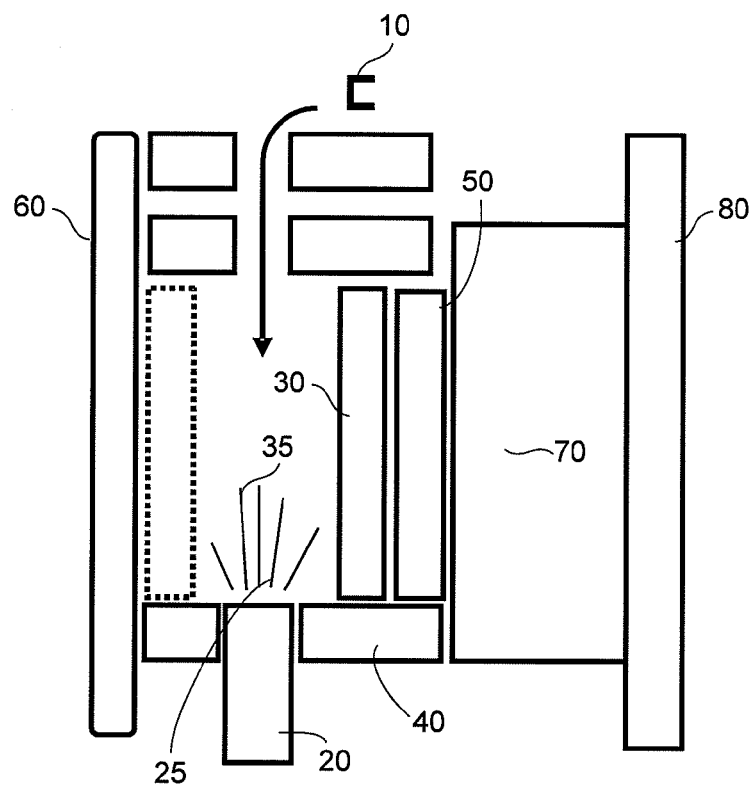
FIG. 3a is a schematic representation of the basic components of the ion source in accordance with the present invention which includes an electron gun, an indirectly-heated cathode, a source liner, a cathode block, a base, an extraction aperture, a source block, and a mounting flange.

FIG. 3a is a simplified schematic representation of the basic components of the ion source, indicating the electron gun cathode 10, the indirectly-heated cathode (IHC) 20, an ionization volume liner 30, a cathode block 40, a base or interface block 50, extraction aperture plate 60, a source block 70, and a mounting flange 80. The ionization volume liner 30 is preferably made of $TiB_2$ or aluminum, but may be usefully constructed of SiC, $B_4C$, C, or any other suitable electrically conductive material which is not a deleterious contaminant in silicon circuits, and can sustain an operating temperature of between 100 C and 500 C. The cathode block 40 is preferably of aluminum due to its high thermal and electrical conductivity, and resistance to attack by halogen gases. Al also allows for direct water cooling since it is non-porous and non-hydroscopic. Other materials may be used such as refractory metals like tungsten and molybdenum which have good electrical and thermal properties; however they are readily attacked by halogen gases. Another consideration for the cathode block is compatibility with ion bombardment of $P^+$, $As^+$, and other species produced under arc discharge operation. Since the cathode block is unipotential with the IHC cathode 20, it is subject to erosion by ion bombardment of plasma ions. The sputter rates of materials under bombardment by ions of interest therefore must be considered as it will impact useful source life. The base 50, again, is preferably made of aluminum, but can be made of molybdenum or other electrically and thermally conductive materials. Since the source block 70, mounting flange 80, and ion extraction aperture 60 are typically operated at 200 C or below, they can be usefully constructed of aluminum as well The ionization volume liner 30 surrounds an ionization volume 35 and is in light thermal contact with the mounting base 50, which is itself in good thermal contact with the source block 70. Except for a slot through the ionization volume liner 30 and the extraction aperture plate 60 through which ions pass, the ionization volume of the ion source is fully bounded by a cylindrical bore through the ionization volume liner 30 and the top and bottom plates of the cathode block 40. The source block 70 is temperature controlled to up to 200 C, for example. Thus, when the electron gun 10 is active, very little power is transferred to the ionization volume liner 30, the temperature of which is close to that of the source block 70. When the IHC 100 is energized, the ionization volume liner 30 is exposed to hundreds of watts of power and can attain a much higher temperature than the source block 70 (up to 400 C or higher), which is beneficial to limit condensation of gases onto the surface of the ionization volume liner 30.

Figure 3B:
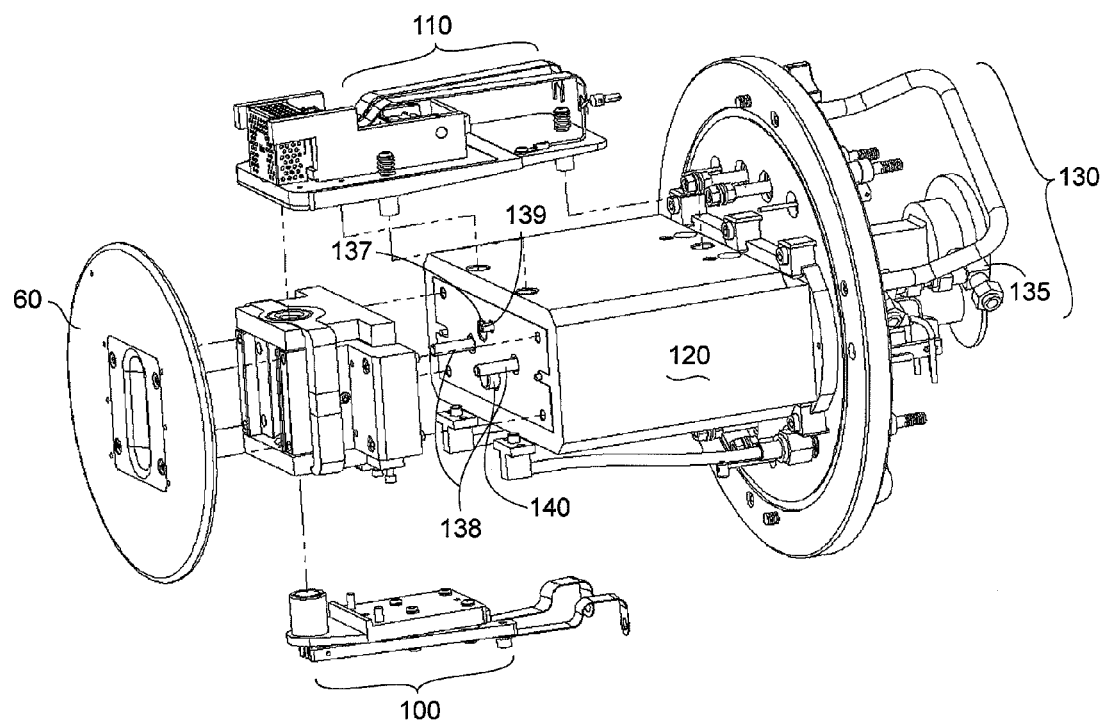
FIG. 3b is an exploded view of the ion source of the present invention, illustrating the major subsystems of the ion source.

FIG. 3b is an exploded isometric view of the ion source of the present invention, showing its major subsystems. The ion source includes an ion extraction aperture plate 60, an ionization volume or chamber assembly 90, an IHC assembly 100, an electron gun assembly 110, a source block assembly 120, and a mounting flange assembly 130. The ion source also includes a low-temperature vaporizer (not shown) coupled to a port 135. A vapor conduit 137 is used to transport the vapor into the ionization assembly 90. The ion source also includes dual hot vapor inlet ports 138, a process gas inlet port 139, and an optional reactive gas inlet port 140. In an exemplary, embodiment atomic F may fed to the ionization volume assembly 90 via the reactive gas inlet port 140. Vaporized As, P, or $SbO_3$ into the dual hot vapor inlet ports 138 while $B_{18}H_{22}$ vapor may be applied to the vapor conduit 137.

Figure 4A:
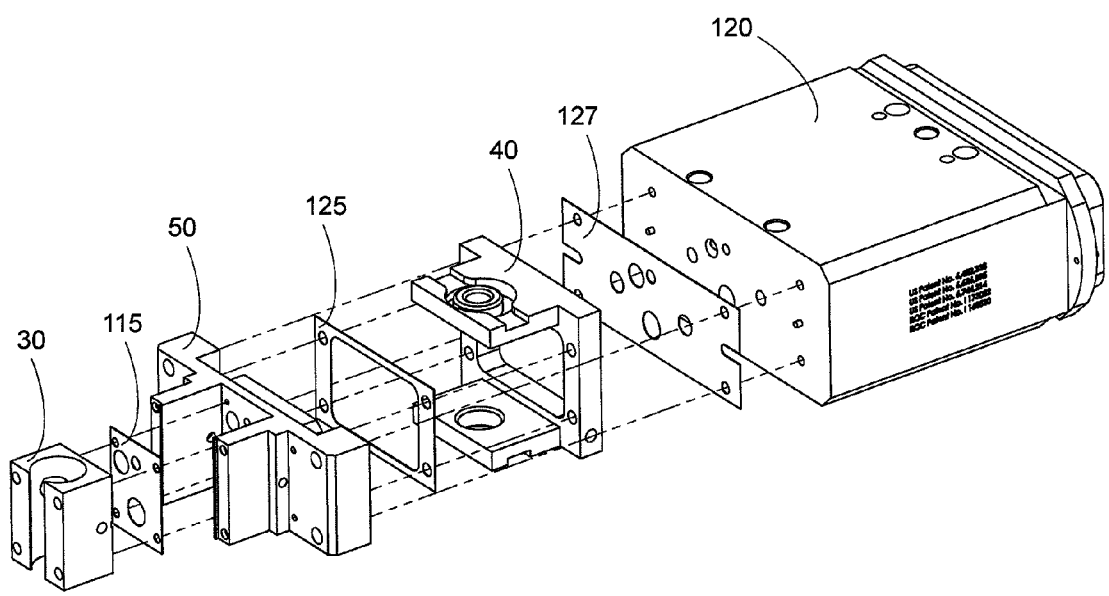
FIG. 4a is an exploded isometric view of the ion source illustrated in FIG. 3a, shown with the mounting flange assembly, electron gun assembly, indirectly heated cathode assembly and the extraction aperture plate removed.

FIG. 4a is an exploded isometric view of the ion source in accordance with the present invention, shown with the mounting flange assembly 130, electron gun assembly 110, indirectly heated cathode assembly 100 and the extraction aperture plate 60 removed. The ion source includes a source block 120, a cathode block 40, mounting base or interface block 50, an ionization volume or source liner 30, a liner gasket 115, a base gasket 125, and a cathode block gasket 127. As will be discussed in more detail below and as illustrated in FIG. 4c, when the magnetic yoke assembly 150 is added, these parts form an ionization volume assembly 90 (FIG. 3b). The gaskets 125 and 127 are electrically insulating, thermally conductive gaskets, fabricated from polymer compounds, for example. Their purpose is to prevent thermal isolation of the parts while allowing for potential differences between the mating parts. For example, the cathode block 40 is at several hundred volts below the base or interface block 50 potential during arc discharge operation, and so must be electrically isolated. However, during electron impact operation, the cathode block 40 should be near the temperature of the base or interface block 50, and so it cannot be thermally isolated. The gasket 115, however, is a metal gasket which forms the interface between the ionization volume liner 30 and the base or interface block 50. Metal was chosen because of its ability to withstand the higher temperatures the ionization volume liner 30 will reach during arc discharge operation. Since the base or interface block 50 is effectively heat sunk to the source block 120 (which is a constant temperature reservoir, i.e., it is actively temperature controlled through embedded ohmic heaters coupled to a closed-loop controller), it tracks near the source block 70 temperature. The source block 70 is actively temperature controlled, and the separate source elements track this temperature through carefully selected thermal contact paths, as described in FIG. 13. Closed loop control of the source block 70 temperature may be implemented using a conventional PID controller, such as the Omron E5CK digital controller, which can be used to control the duty cycle of the power delivered to the ohmic heaters embedded in the source block, as is known in the art.

Figure 4B:
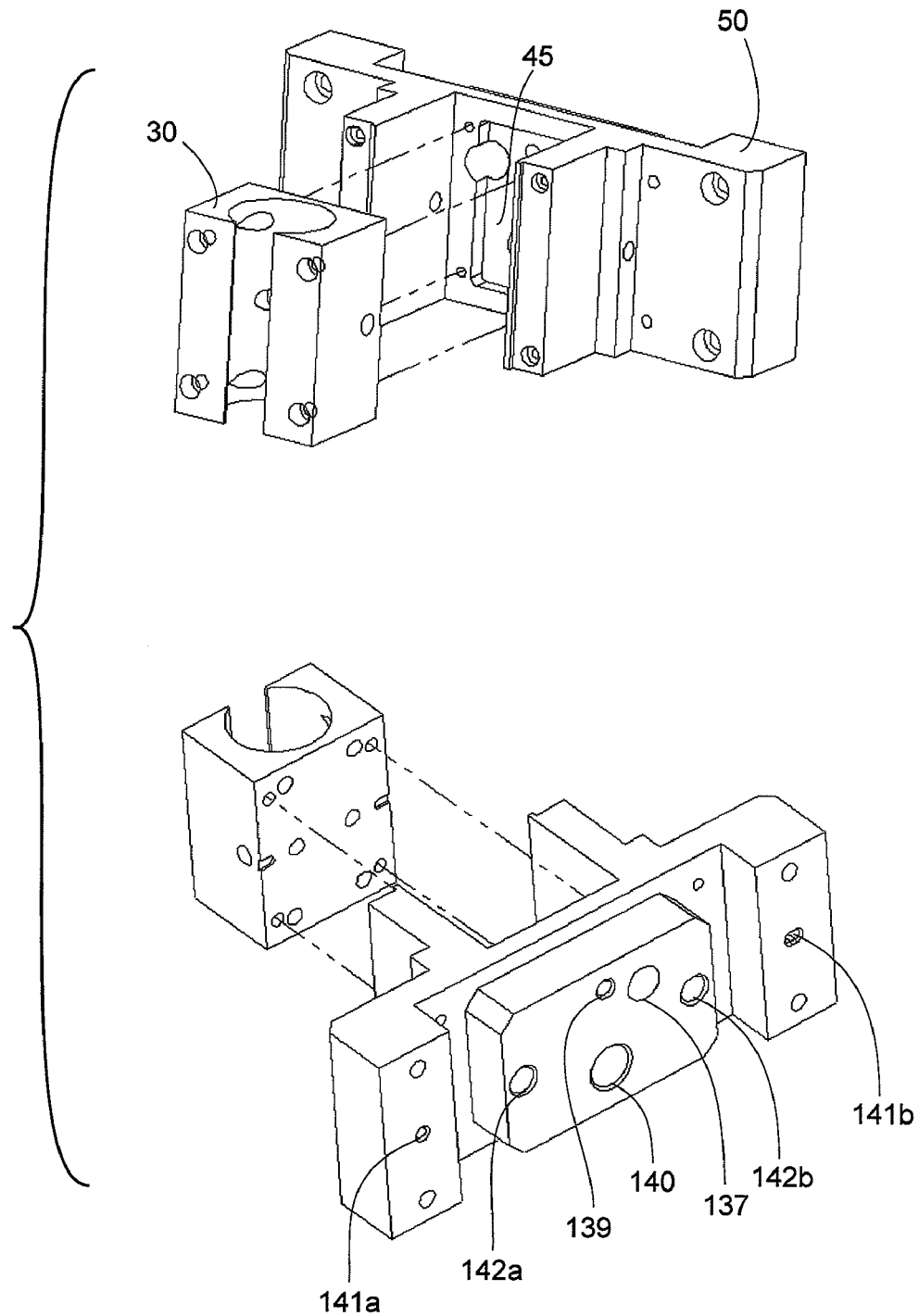
FIG. 4b is an exploded isometric view of the ionization volume liner and the interface or base block showing the plenum and the plenum ports in the interface block.
Figure 4C:
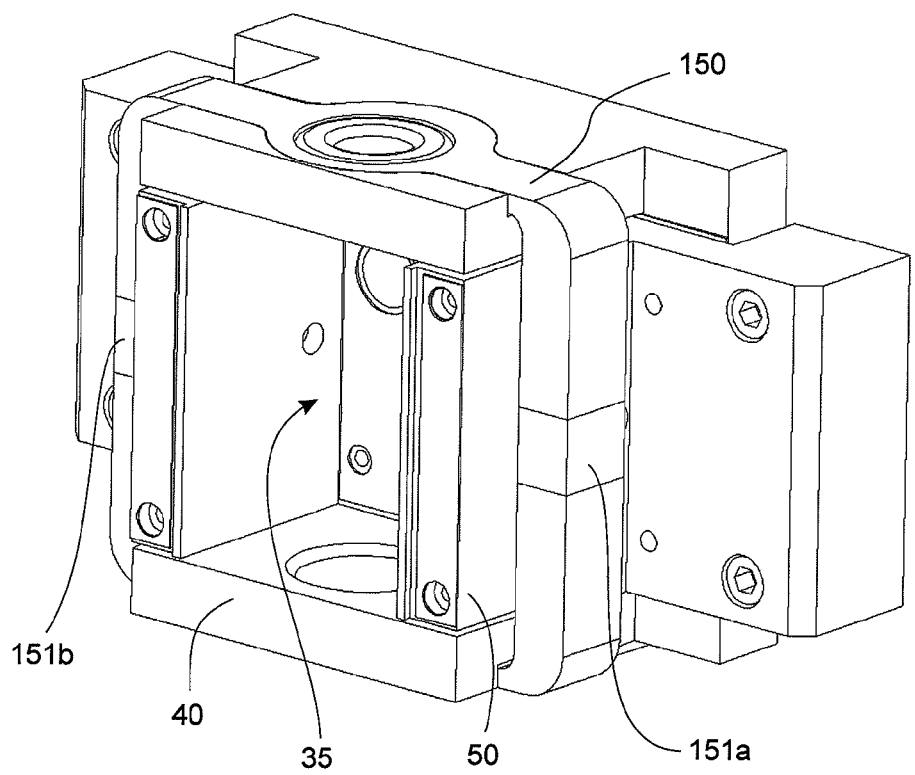
FIG. 4c is an isometric view of the ionization volume assembly in which the ionization volume is formed from a cathode block, an interface block, and a magnetic yoke assembly, shown with the ionization volume liner removed.

FIG. 4b is an exploded isometric view of the ionization volume liner 30 and the interface or base block 50, showing the plenum and the plenum ports in the interface block 50. The several gas and vapor inlet ports, namely vapor port 137, reactive gas port 140, process gas port 139, and dual hot vapor ports 141a and 141b, feed into a gas plenum 45, formed in the base or interface block 50. The interface block 50 is provided with one or more through holes 142a and 142b to accommodate mounting conventional fasteners (not shown) to secure the interface block 50 to the source block 120 and thereby establish electrical conductivity between the interface block 50 and the source block 120). The gas plenum 45 may be cavity machined into the interface block 50 and is used to collect any of the gases fed into the plenum 45 and feed them into multiple liner ports 32. The multiple liner ports 32 are configured in a "shower head" design to distribute the gases along different directions into the ionization volume 35 within the ionization volume liner 30. By transporting all of the gases or vapors into the plenum 45, which acts as a ballast volume, which then feeds the gases through a shower head directly into the ionization volume 35, produces a uniform distribution of gas or vapor molecules within the ionization volume 35. Such a configuration results in a more uniform distribution of ions presented to extraction aperture 60, and the subsequent formation of a more spatially uniform ion beam.

FIG. 4c is an isometric view of the ionization volume assembly 90, shown with the ionization volume liner removed. The ionization volume assembly 90 is formed from the cathode block 40, the interface block 50, and the magnetic yoke assembly 150. The magnetic yoke assembly 150 is constructed of magnetic steel and conducts the magnetic flux produced by a pair of permanent magnets 151a and 151b around through ionization volume assembly 90, producing a uniform magnetic field of about 120 Gauss, for example, within the ionization volume 35. During electron impact operation, this permanent field confines the electron beam so that the ions are produced in a well-defined, narrow column adjacent to the ion extraction aperture 60. During arc discharge mode, the same field provides confinement for the plasma column between cathode and the upper plate of the cathode block 40, which serves as an anticathode.

Figure 5A:
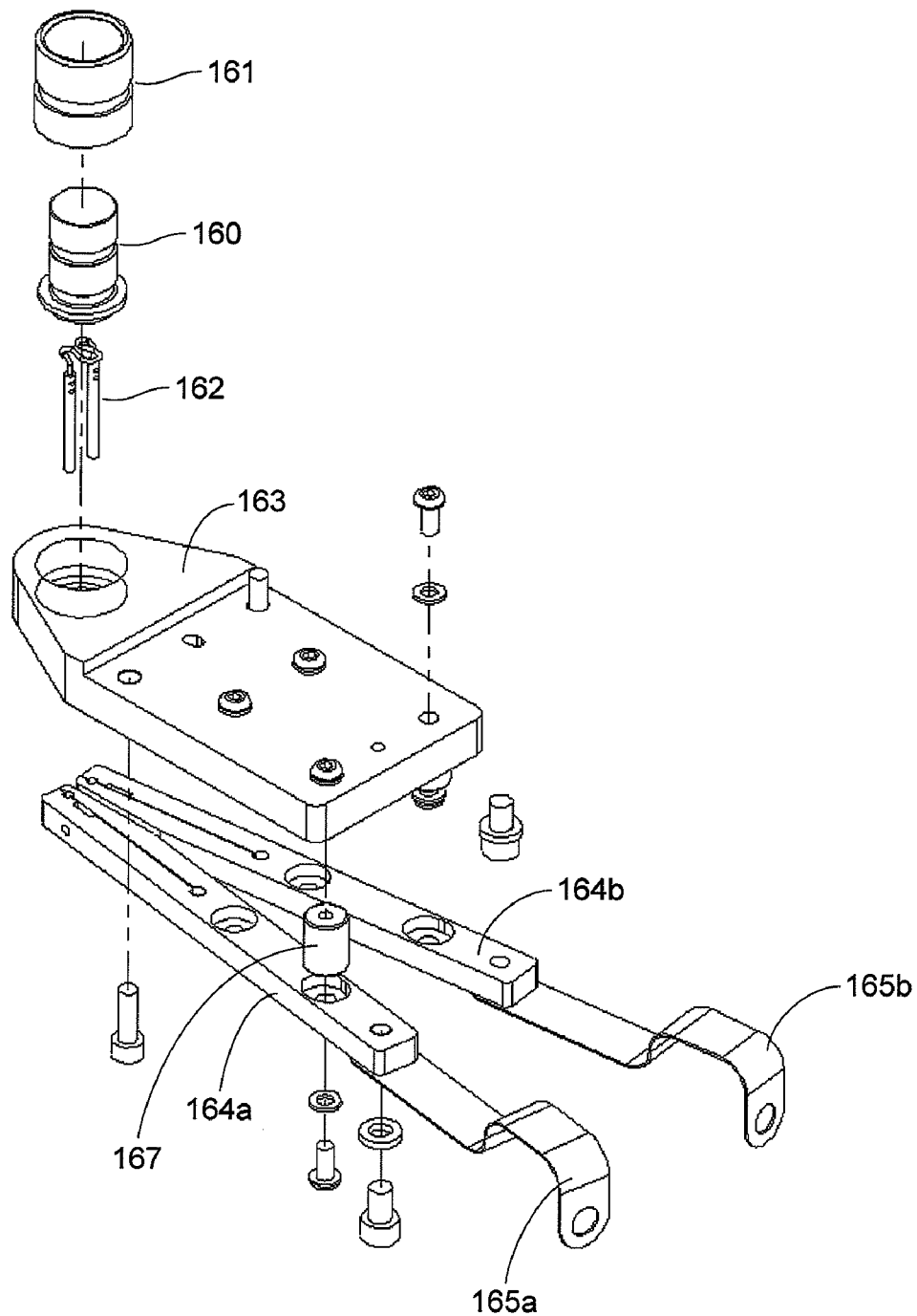
FIG. 5a is an exploded isometric view of a indirectly-heated cathode (IHC) assembly in accordance with one aspect of the present invention.

FIG. 5*a* is an exploded view of the indirectly-heated cathode (IHC) assembly 100. IHC assemblies are generally known in the art. Examples of such IHC assemblies are disclosed in U.S. Pat. Nos. 5,497,006; 5,703,372; and 6,777,686, as well as US Patent Application Publication No. US 2003/0197129 A1, all hereby incorporated by reference. The principles of the present able invention are applicable to all such IHC assemblies. An alternate IHC assembly 100 in for use with the present invention includes an indirectly-heated cathode 160, a cathode sleeve 161, a filament 162, a cathode plate 163, a pair of filament clamps 164*a* and 164*b*, a pair of filament leads 165*a* and 165*b*, and a pair of insulators 167*a* and 167*b* (not shown). The filament 162 emits up to 2 A, for example, of electron current which heats the indirectly-heated cathode 160 to incandescence by electron bombardment. Since the filament 162 is held at a negative potential of up to 1 kV below the cathode potential, up to 2 kW of electron beam heating capacity is available for cathode heating, for example. In practice, heating powers of between 1 kW and 1.5 kW are sufficient, although for very high arc currents (in excess of 2 A of arc) higher power can be required. The cathode 160 is unipotential with the cathode mounting plate 163. The insulators 167*a* and 167*b* are required to stand off the filament voltage of up to 1 kV.

Referring now to FIGS. 5*b* and 5*c*, the IHC 160 is located onto the cathode plate 163 via a flange 159 and is locked into position by sleeve 161 through threaded connection 156. The sleeve 161 serves as a radiation shield for the IHC 160, minimizing heat loss through radiation, except at the emitting surface 157.

The indirectly heated cathode (IHC) 160 may be machined from a single tungsten cylinder. An exemplary IHC 160 may be about 0.375 inch thick, and is robust against both F etch and ion bombardment. As seen in FIG. 5*c*, the IHC 160 has the appearance of a thick circular disk joined to a hollow cylinder which has a bottom flange 159 which registers the IHC 160 within its mounting part, cathode plate 163. Two or more circular grooves 158 or saw cuts are machined into the cylinder to reduce the conduction of heat from the cathode emission surface 157 to the cathode plate 163, reducing electron beam heating requirements. A similar groove 153 is machined into the sleeve 161 to reduce heat transfer to the cathode plate 163. The sleeve 161 attaches to the cathode plate 163 via threads in the plate 163 and the sleeve 161. The sleeve 161 serves two functions: it "locks down" IHC 158, and acts as a radiation shield between the IHC 160 and its environment, reducing heating power requirements. Note that the IHC 160 and its sleeve 161 are enclosed by the water-cooled cathode block 40 which is designed to absorb radiation to reduce overall source heating. Filament 162 is constructed of approximately 1 mm-thick tungsten wire twisted into a three-bend pattern which provides fairly uniform emission current coverage onto the bottom of the IHC 160 disk. The filament 162 is attached to dual clamps 164*a* and 164*b* which conduct current through dual leads 165*a* and 165*b* to a vacuum feedthrough and to a 60 A filament power supply. This power supply, and hence the filament, is floated to a negative potential relative to the IHC by a high voltage power supply, so that electron emission current leaving the filament 162 is accelerated to the IHC 160, providing electron beam heating. This 2 A, 1 kV power supply provides up to 2 kW of electron beam heating power to bring the cathode surface 157 to electron emission. In practice, 1 kW of electron beam heating is sufficient (1.7 A at 600V, for example), but for IHC arc currents of over several amperes, higher cathode temperature and hence higher power is needed.

The IHC 160, sleeve 161, and filament 162 are preferably made of tungsten. The filament leads shown in FIG. 5*b* are crimped onto the filament 162, and are usefully made of molybdenum or tantalum, for example. The cathode plate 163 can be made of graphite, stainless steel, molybdenum, or any high temperature, electrically conductive material having good mechanical tensile strength. Since the cathode plate 163 mounts directly to the cathode block, it is at cathode potential when the IHC 160 is energized.

Figure 5D:
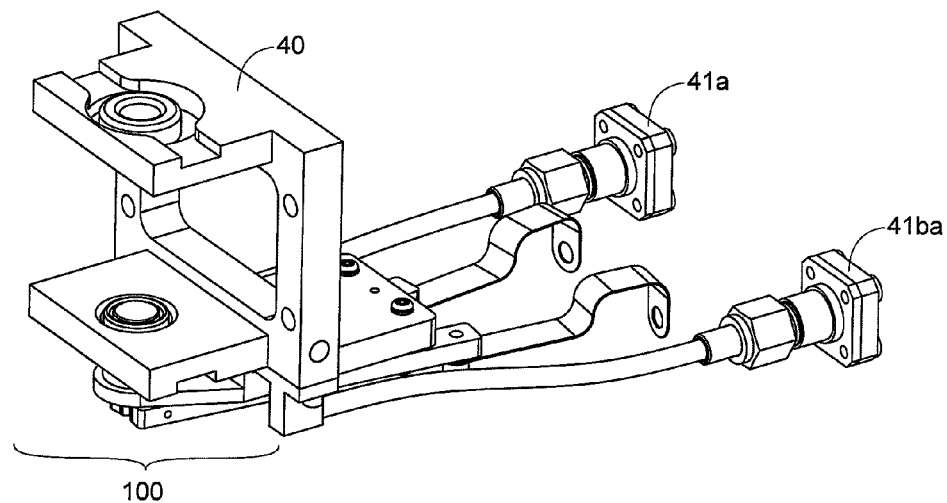
FIG. 5d is an isometric view of a water-cooled cathode block shown assembled to the IHC assembly illustrated in FIG. 5a in accordance with one aspect of the invention.
Figure 5E:
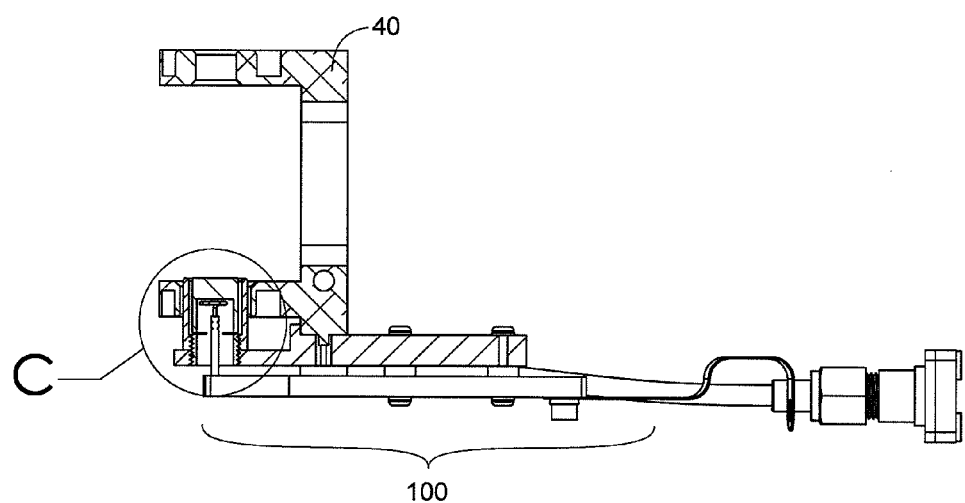
FIG. 5e is an elevational view of the assembly illustrated in FIG. 5d illustrating the cathode block and the cathode plate of the IHC assembly in section.

FIGS. 5*d* and 5*e* illustrate the indirectly-heated cathode assembly 100 mounted onto the water-cooled cathode block 40. A pair of water fittings 41*a* and 41*b* are used to transport de-ionized water through a vacuum interface. The water circulates through the cathode block 40 and can absorb several kW of power, allowing the cathode block 40 to remain well below 100° C. at all times. The IHC 160 is unipotential with the cathode block 40. As such, no insulation is required between the cathode 160 and cathode block 40, which forms the top and bottom boundary surfaces of the ionization volume 35. This results in a very reliable system, since in prior art IHC sources, the IHC is up to 150V different from its immediate surroundings. This results, in turn, in quite common failures precipitated by the collection of debris between the IHC 160 and the ionization volume surface through which it penetrates. Another benefit of the configuration is that it eliminates the common failure of anticathode erosion since the top plate of cathode block 40 serves as the anticathode since it is at cathode potential. The plasma column is bounded by the ionization volume 35 is defined by the bore through the ionization volume liner 30 and the top and bottom plates of the cathode block 40. This defines a very stable volume to sustain the plasma column during arc discharge operation.

Figure 5F:
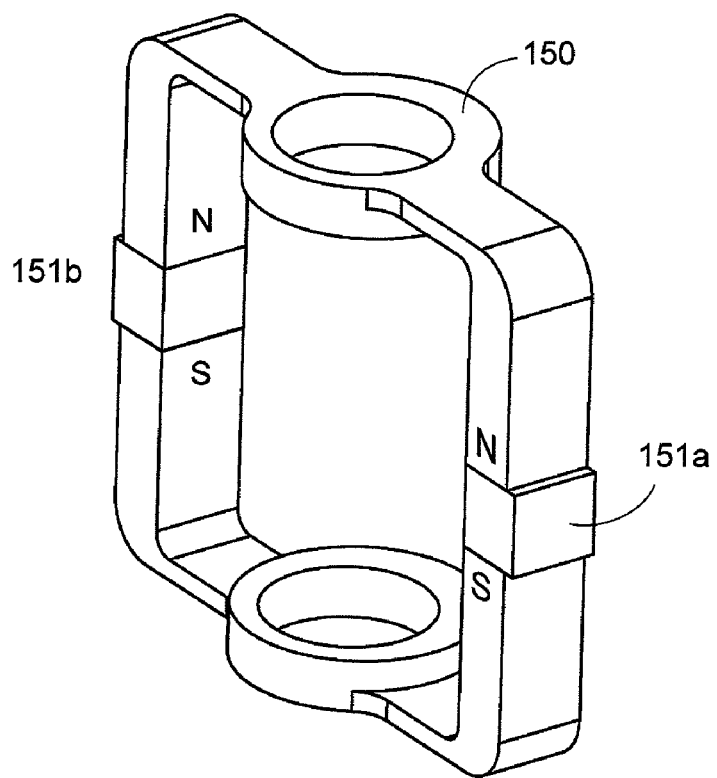
FIG. 5f is an isometric view of a magnetic yoke assembly which surrounds the cathode block and ionization volume In accordance with the present invention.

FIG. 5*f* shows a detail of the magnetic yoke assembly 150 which surrounds the cathode block 40 and the ionization volume 35. The magnetic yoke assembly 150 is constructed of magnetic steel and conducts magnetic flux through an ionization volume or chamber assembly 90, producing a uniform axial magnetic field of about 120 Gauss, for example, within the ionization volume 35. This magnetic yoke assembly 150 is used to generate a magnetic field to confine the plasma generated in the ionization volume 35 during an arc discharge mode of operation. During an electron impact mode of operation, the electron gun assembly 110 is shielded from the magnetic field because of a magnetic shield which is inserted between the yoke assembly 150 and the electron gun, as indicated in FIG. 7 below.]

Figure 6B:
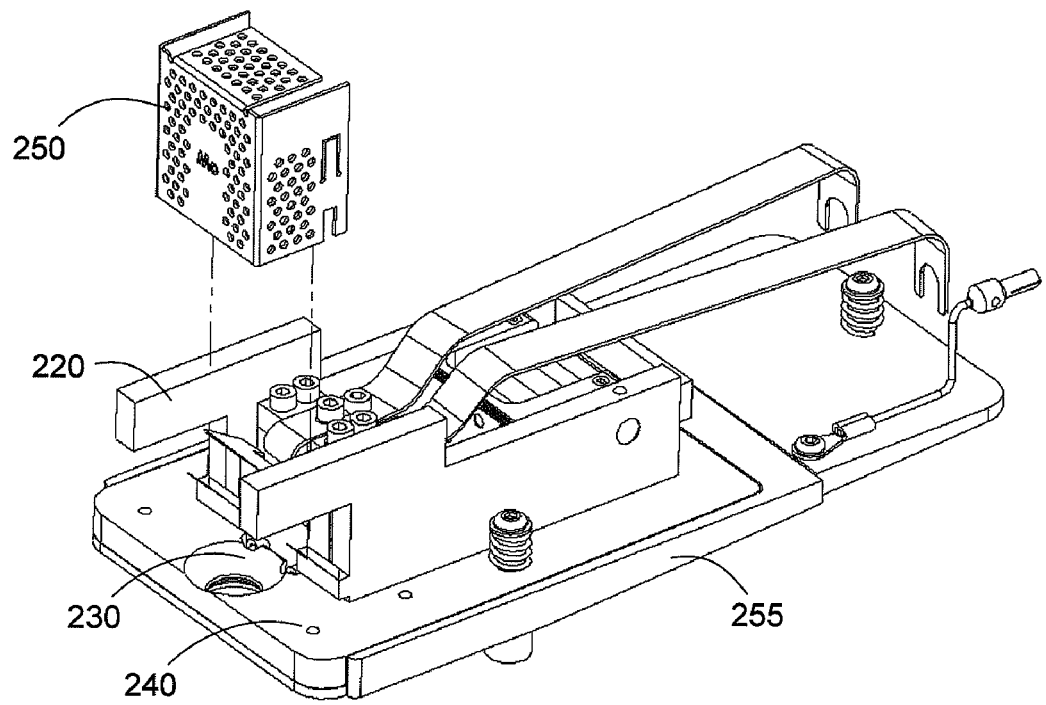
FIG. 6b is an isometric view of an electron gun assembly in accordance with the present invention shown with an electrostatic shield assembly removed.
Figure 6A:
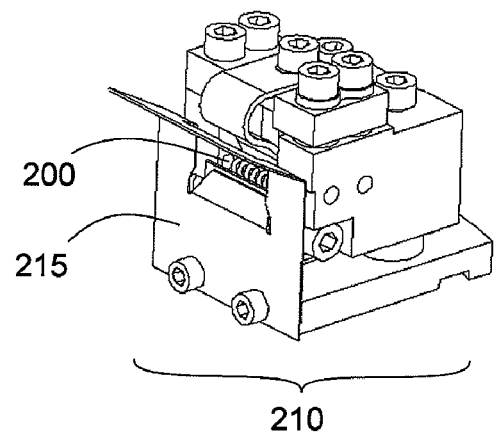
FIG. 6a is an isometric view of an emitter assembly which forms a portion of the external electron gun assembly in accordance with one aspect of the present invention.

FIGS. 6*a* and 6*b* illustrate the external electron gun assembly 110. In particular, Such electron gun assemblies are disclosed in detail in U.S. Pat. No. 6,686,595 as well as US Patent Application Publication No. US 2004/0195973 A1, hereby incorporated by reference. FIG. 6*a* is an isometric view of an exemplary emitter assembly 210 which forms a part of the external electron gun assembly 110. FIG. 6*b* is an isometric view of an electron gun assembly 110, shown with an electrostatic shield assembly 250 removed. The electron gun assembly 110 includes a gun base 240, which carries an emitter assembly 210, an anode 215, an electrostatic shield assembly 250 and a magnetic shield 255.

Electrons emitted from a filament 200 in the emitter assembly 210 are extracted by the anode 215 and bent through 90 degrees by the magnetic dipole 220, passing through an aperture 230 in the gun base 240. The electron beam is shielded from the magnetic fields within the ionization volume assembly 90, generated by the magnetic yoke 150, by a magnetic shield 255. The anode 215, gun base 240, and the electrostatic shield assembly 250 are all at anode potential, as high as, for example, 2 kV above the potential of the ionization volume assembly 90, which is held at the potential of the source block 120 during electron impact operation. The filament voltage, for example, is several hundred volts negative; thus, the electron beam is decelerated between the gun base 240 and the ionization volume 35, as described in detail, for example by Horsky in U.S. Pat. No. 6,686,595, hereby incorporated by reference.

Figure 7:
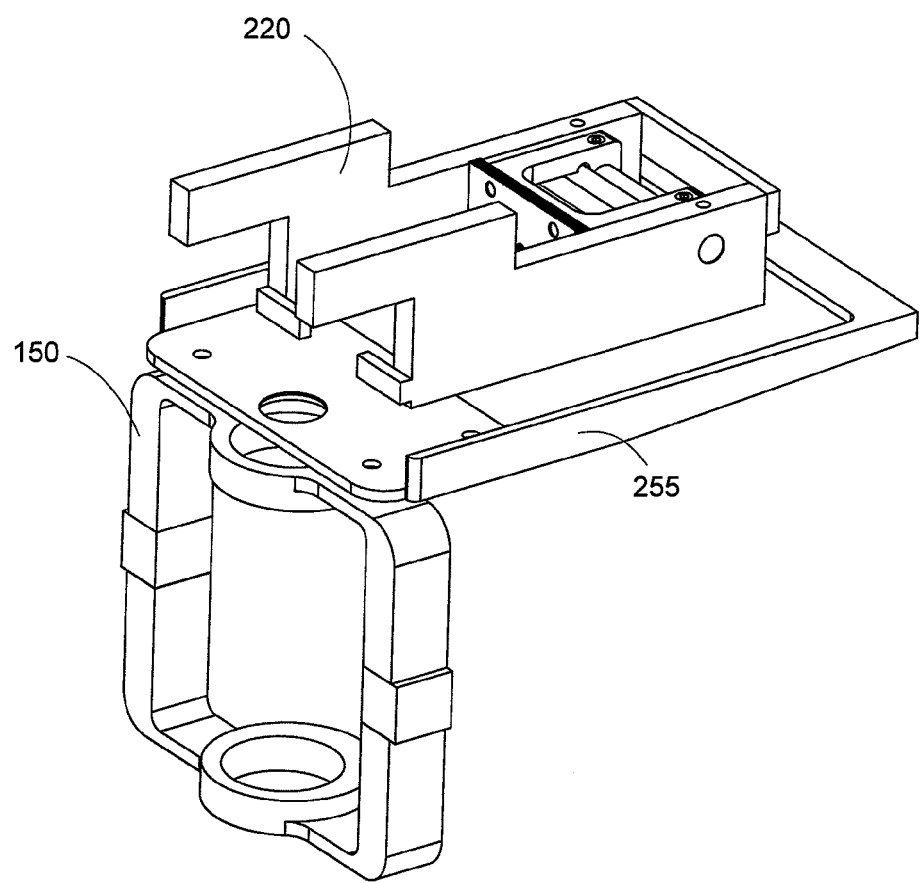
FIG. 7 is an isometric view illustrating a magnetic circuit associated with the electron gun and ionization volume yoke assembly.

FIG. 7 is a physical representation of the magnetic circuit associated with the electron gun assembly 110 and the magnetic yoke assembly 150. As shown, the magnetic circuit consists of the magnetic dipole 220, the gun magnetic shield 255, and the magnetic yoke assembly 150. Magnetic dipole 220 is made of magnetic stainless steel, and produces a uniform transverse magnetic field across the poles, bending the electron beam produced by the electron gun emitter through approximately 90 degrees. Thus deflected, the electron beam passes through the aperture 230 of FIG. 6, and into the ionization volume, where it is confined by the chamber magnetic field.

Figure 8:
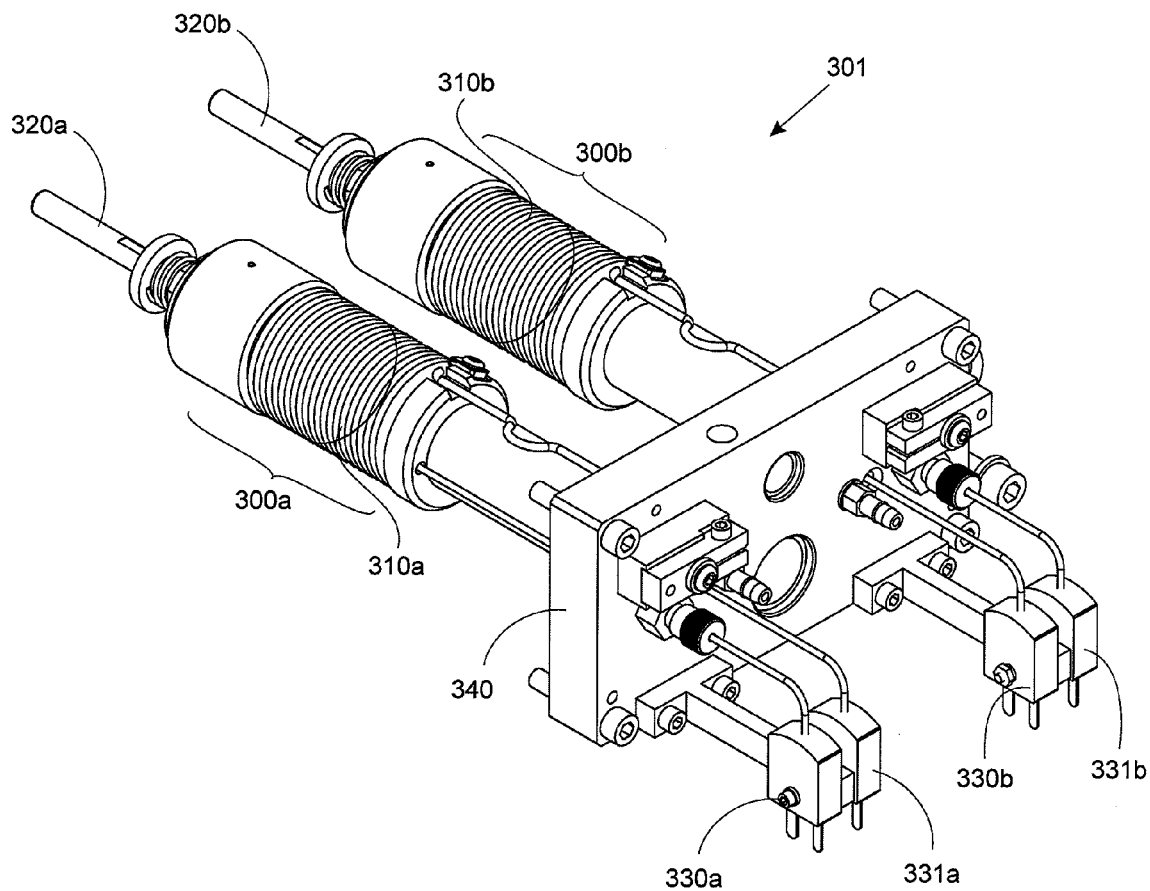
FIG. 8 is an isometric view of an exemplary dual hot vaporizer assembly in accordance with one aspect of the present invention.

FIG. 8 is an isometric view of an exemplary dual hot vaporizer assembly 301. The dual hot vaporizer assembly 301 includes dual vaporizer ovens 300a and 300b, heater windings 310a and 310b, and a pair of vapor nozzles 320a and 320b. Solid source material, such as As, P, $Sb_2O_3$, or $InF_3$, resides within the oven cavities, which are hollow steel cylinders. Sometimes the material is captured by a graphite crucible which forms a liner between the material and cylinder, preventing contamination of the oven walls. The oven heater windings 310a and 310b carry up to 20 A of current at 48V DC, and can dissipate up to 1 kW of heater power. They are brazed onto the ovens for good thermal contact. The nozzles 320a and 320b are usefully fabricated of molybdenum for good temperature uniformity, but can be made of steel or other high temperature, conductive materials. The nozzles are preferable ¼ inch tubing and no longer than two inches long, to ensure good vapor conductance from oven to ionization volume. The temperature of the ovens 300a and 300b is monitored by a pair of thermocouples 330a and 330b. The temperature of the heater windings 310a and 310b is monitored by a pair of thermocouples 331a and 331b.

Figure 9B:
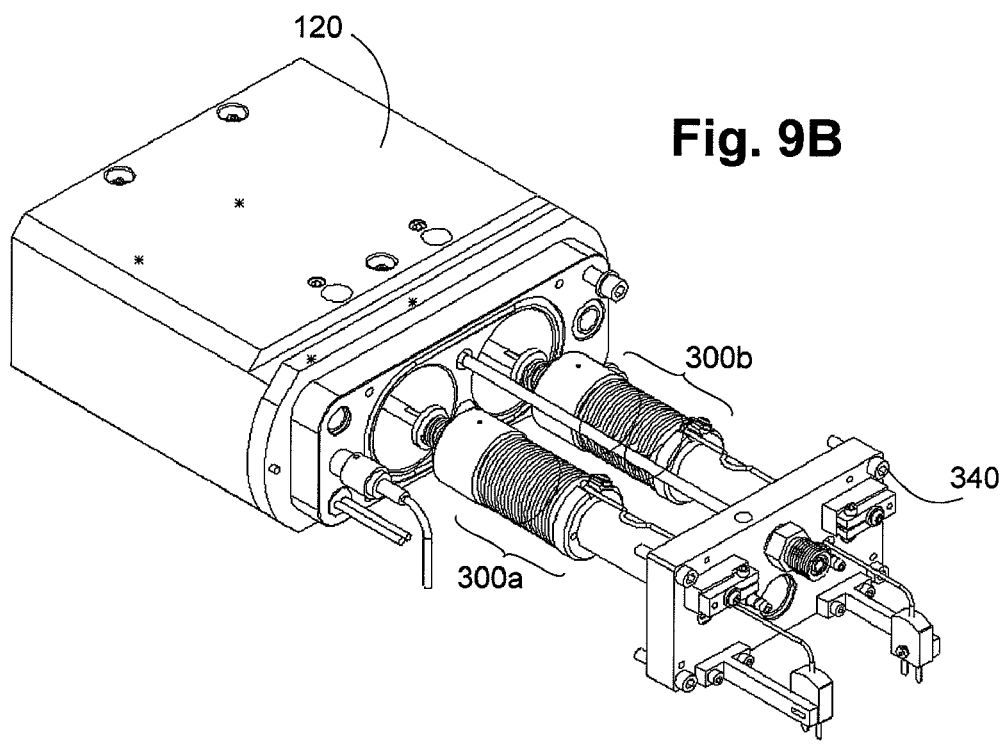
FIG. 9b is similar to FIG. 9a but shown with the hot vaporizer assembly removed.
Figure 9A:
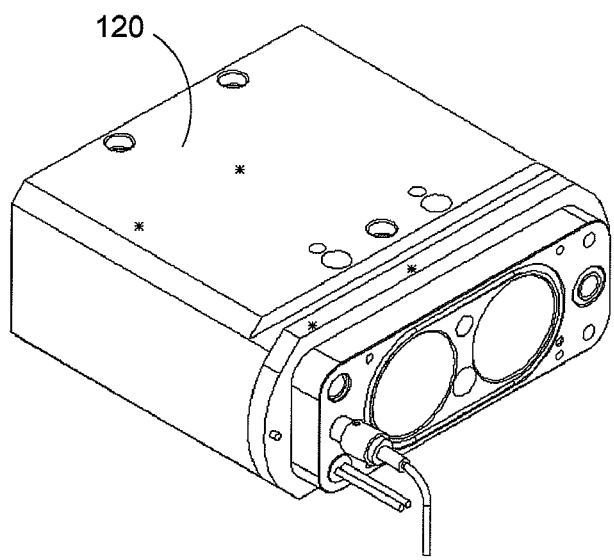
FIG. 9a is an isometric view of a source block in accordance with the present invention.

A mounting plate 340 is used to couple the dual hot vaporizer assembly 301 to the source block 70. FIG. 9a shows the source block 70 with the dual hot vaporizer assembly 301 removed while FIG. 9b illustrates the source block with the hot vaporizer assembly 301 being inserted.

Figure 10:
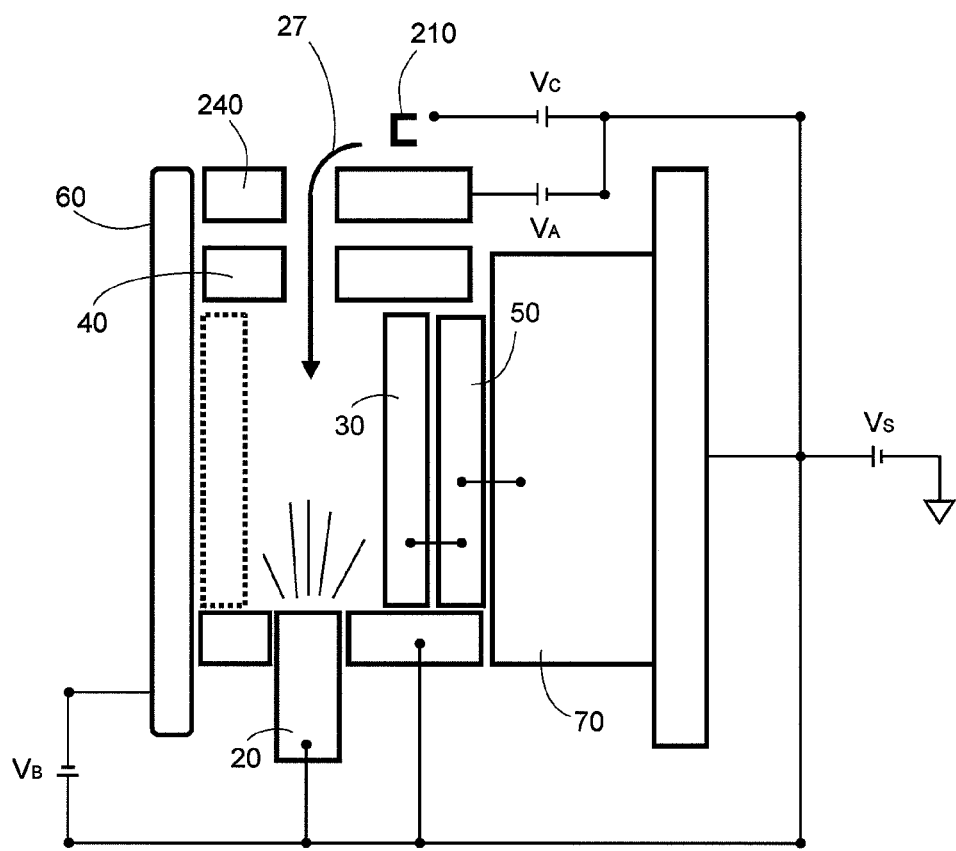
FIG. 10 is a diagram which illustrates the typical voltages applied to each element of the ion source when operating in electron-impact ionization mode.

FIG. 10 is a diagram which illustrates the typical voltages applied to each element of the ion source when operating in electron-impact ionization mode. All voltages are referenced to source potential Vs, which is positive with respect to ground. The mounting base or interface block 50, the cathode block 40, and the source block 70 are held at Vs. The electron gun filament 200 is held at cathode potential Vc by its related power supply ($-1$ kV$<$Vc$<-100$V), and the potential of the anode 240 Va is positive (1 kV$<$Va$<$2 kV), so that the kinetic energy of the electrons leaving the filament 200 and forming the electron beam 27 is e(Va-Vc). The ion extraction aperture plate 60 is biased to either a positive or negative voltage to improve the focusing of the extracted ion beam ($-350$ V$<$Vb$<$350 V). The IHC assembly 100 is not energized during an electron-impact ionization mode and is held at the potential Vs during this mode.

Figure 11:
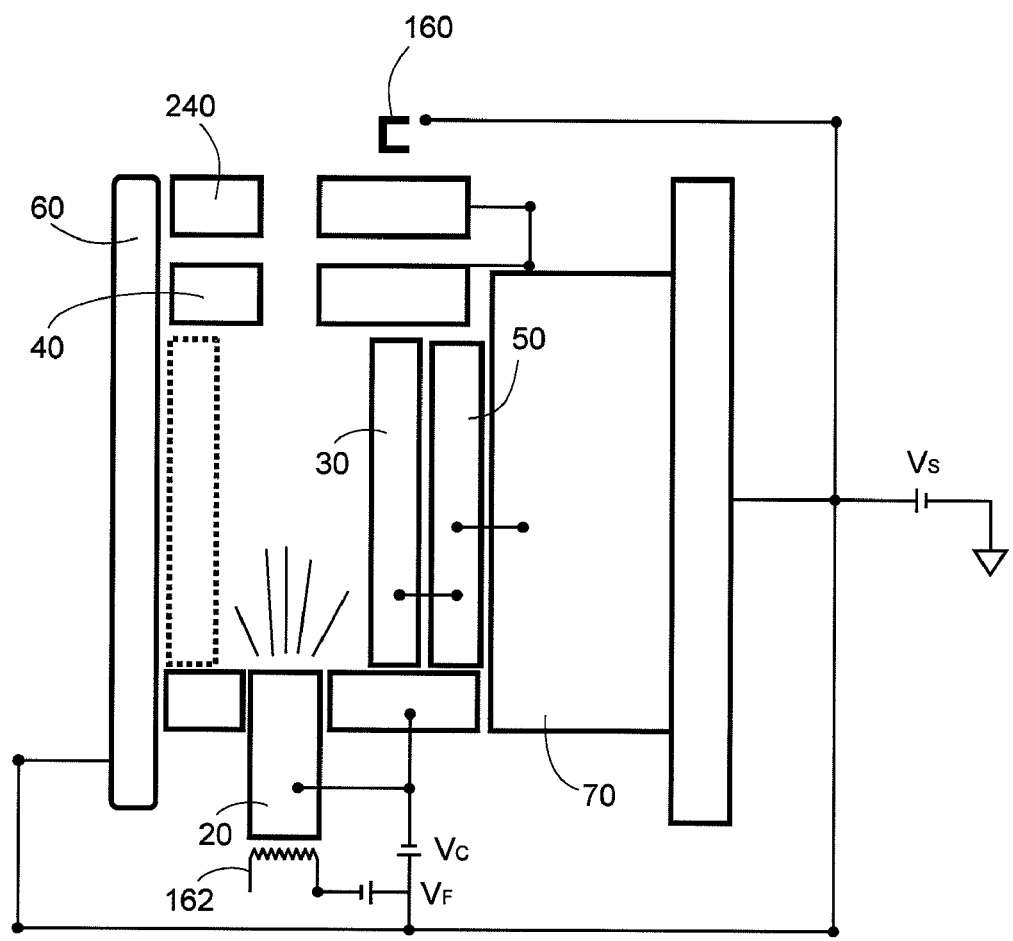
FIG. 11 is similar to FIG. 10 but indicates the typical voltages applied to each element of the ion source when operating in arc discharge mode.

FIG. 11 is similar to FIG. 10 but indicates the typical voltages applied to each element of the ion source when operating in arc discharge mode. All voltages are referenced to source potential Vs which is positive with respect to ground. The electron gun assembly 110 is not used, but the cathode supply is connected to the IHC cathode 160 Vc ($-100$V$<$Vc$<-0$), which is unipotential with the cathode block 40. Since the electron gun assembly is not used in this mode, its filament 200 and anode 240 are held at cathode voltage Vc. The IHC filament 162 is at up to 1 kV below the IHC 20 potential ($-1$ kV$<$Vf$<$0), and can provide up to 2 A, for example, of electron beam heating current. The IHC 160 is up to 100V, for example, different from its immediate surroundings. FIGS. 12a and 12b are logic flow diagrams of the sequence of steps required to establish each operating mode in succession. Since the voltages of the ion source components are different for the two modes of operation, there is a preferred sequence for moving between modes:

When switching from the electron impact mode 600 to the arc discharge mode 614, as illustrated in FIG. 12a, initially, in step 602, the electron gun assembly 110 is shut off. Next in step 604, the electron gun anode 215 is decoupled from its power supply. In step 606, the electron gun anode 215 is set to cathode potential. This prevents any fields from punching through the cathode block 40 at the upper plate of the cathode block 40, making this an effective anticathode. In step 608, the bias voltage applied to the ion extraction aperture plate 60 is interrupted. The extraction aperture plate 60 bias is only needed in cluster mode, and is not recommended in discharge mode, especially since the power supply may draw high currents due to the proximity of a dense plasma. Next in step 610 water flow into the cathode block 40 is initiated by automatic sequencing of pneumatically actuated water flow valves. The water flow valves are interlocked to the ion source control system through a water flow sensor and relay switch so that the IHC cannot be energized unless flow has been established The cathode block 40 must be water cooled during operation of the IHC assembly 100 to prevent undue heating of the source components, and to keep the magnets 151a, 151b in the magnetic yoke 150 below their Curie temperature. Finally in step 612, an arc can by initiated by the introduction of process gas into the ionization volume 35 and energizing the IHC assembly 100 as is known in the art.

When switching from the arc discharge 614 to the electron impact mode 600, as illustrated in FIG. 12b, initially in step, the IHC assembly 100 is de-energized. Next in step 618, the electron gun anode 215 is connected to its positive power supply. In step 620, the cathode block 40 and the IHC assembly 100 are connected to the to the source voltage. In step 622, the bias voltage is set and connected to the ion extraction aperture plate 60. In step 624, water cooling of the cathode block 40 is terminated. Finally, in step 626, the electron gun assembly 110 is energized to establish an electron beam. Also, vapor is introduced into the ionization volume 35 to begin ionized cluster formation.

Figure 13:
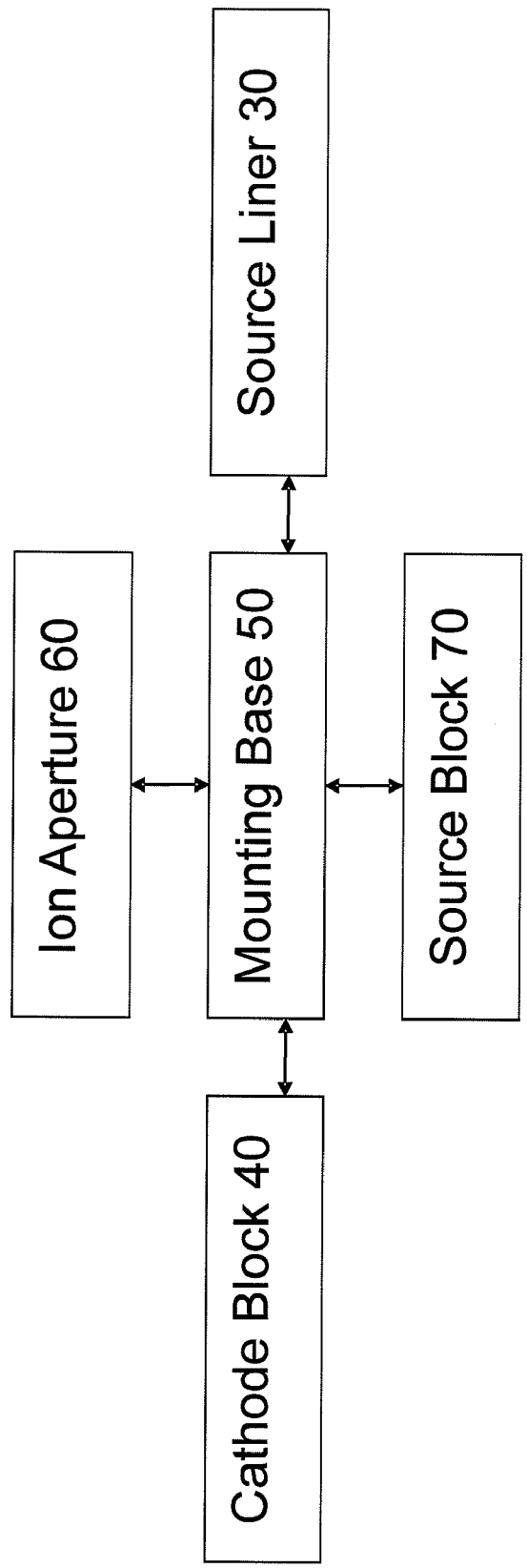
FIG. 13 is a diagram which shows the thermal interfaces between source block, interface block, cathode block, and the ionization volume liner.

FIG. 13 shows the thermal interfaces between source block 70, the interface block 50, the cathode block 40, and the ionization volume liner 30. As further outlined in FIG. 4a, thermal paths are defined between the cathode block 40, the ion extraction aperture 60, the interface or mounting block 50, the ionization volume or source liner 30, and the source block 70 through thermally conductive gaskets which are in wetted contact to the surfaces of these components. Thus, the ionization volume liner 30 can attain higher temperatures than the temperature of source block 70, which is actively temperature controlled. In addition, the water-cooled cathode block 40 has a thermal path to reach the temperature of the mounting base 50 after water cooling is disabled.

Figure 19:
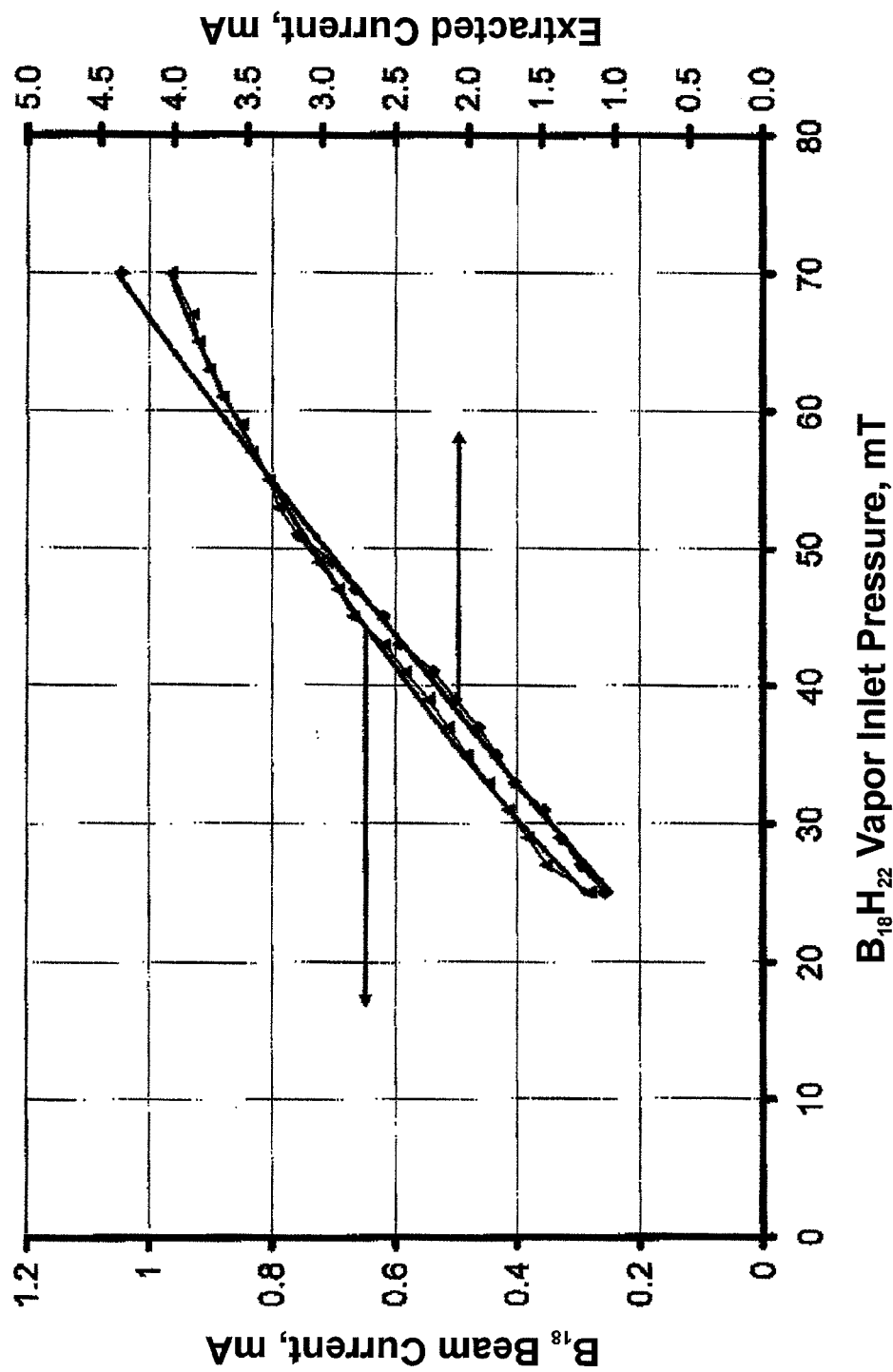
FIG. 19 is a plot of mass-analyzed $B_{18}H_x^+$ beam current delivered to an implanter Faraday cup positioned 2 meters from the ion source and downstream from an analyzer magnet on the left vertical axis, and total ion current extracted from the same ion source shown on the right vertical axis, as a function of vapor flow into the ion source.

FIG. 19 is a plot of mass-analyzed $B_{18}H_x^+$ beam current delivered to a Faraday cup positioned 2 meters from the ion source and downstream from an analyzer magnet, and total ion current extracted from the ion source. Shown are the extracted ion current, in mA, on the right vertical axis, and the Faraday current (similar to on-wafer current) on the left vertical axis. The currents are measured as a function of $B_{18}H_{22}$ vapor flow into the ion source, measured as inlet pressure into the ion source. The vapor was fed into this ion source through a proprietary closed-loop vapor flow controller which has been described in detail elsewhere. The transmission through the extraction optics and beam line of this implanter is about 25%, and begins to fall off at the highest vapor flows, presumably due to charge exchange with the residual vapor.

Figure 20:
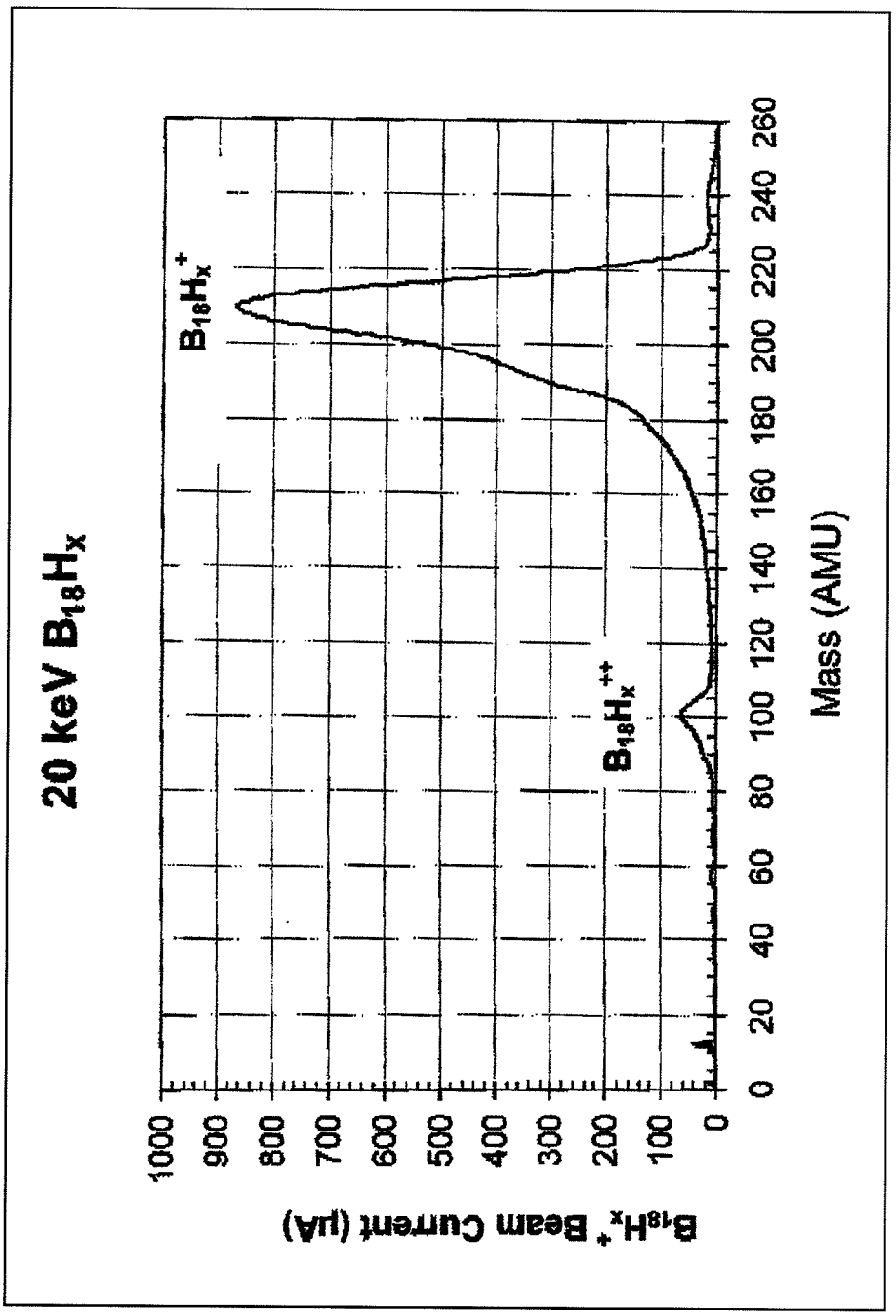
FIG. 20 is a $B_{18}H_{22}$ mass spectrum collected from the ion source of the present invention.

FIG. 20 is a $B_{18}H_{22}$ mass spectrum collected from the ion source of the present invention, in electron-impact mode. The parent peak, $B_{18}H_x^+$, represents about 85% of the beam spectrum. The small peak at half the parent 210 amu mass is doubly ionized $B_{18}H_x^+$, or $B_{18}H_x^{++}$.

Figure 21:
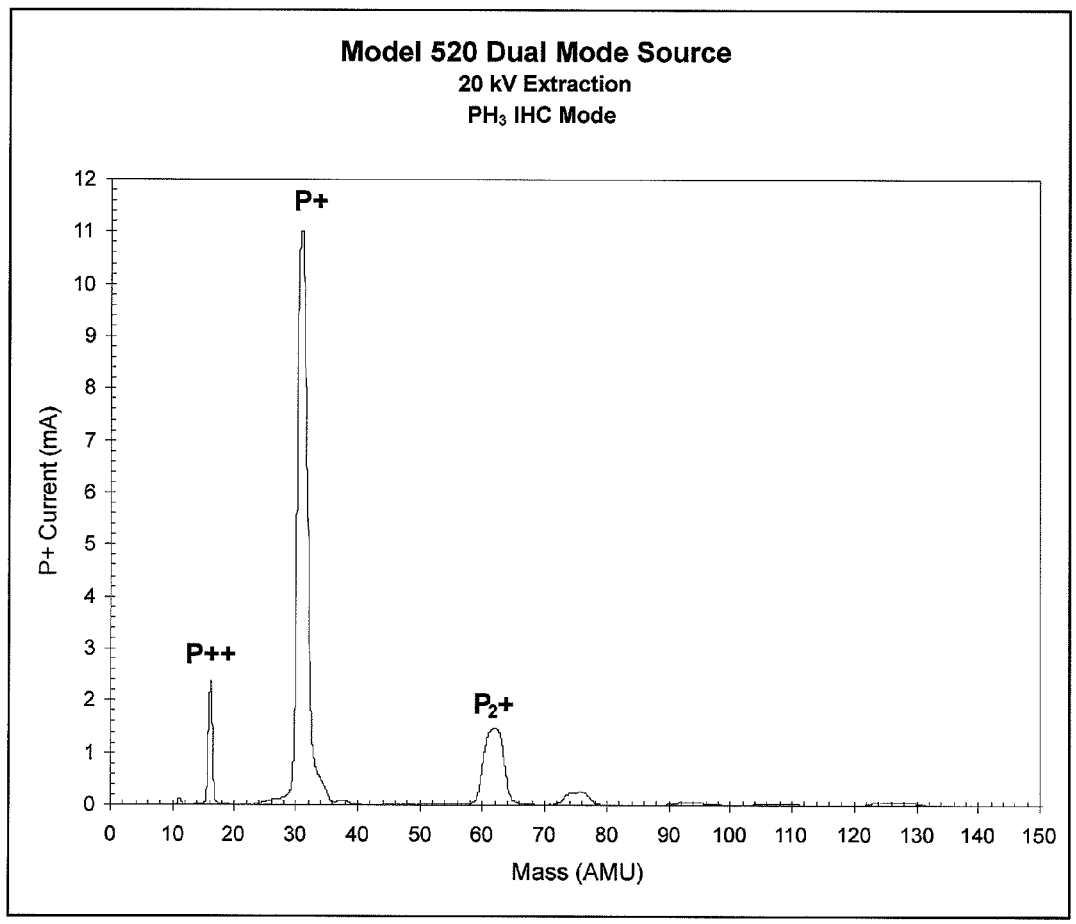
FIG. 21 is a $PH_3$ mass spectrum collected from the ion source of the present invention.

FIG. 21 is a $PH_3$ mass spectrum collected from the ion source of the present invention, in arc discharge mode. Over 10 mA of $^{31}P^+$ current and over 2 mA of doubly ionized phosphorus was delivered to the Faraday of the implanter at 20 kV extraction voltage. This performance is comparable to many commercial Bernas-style ion sources used in ion implantation.

Figure 22:
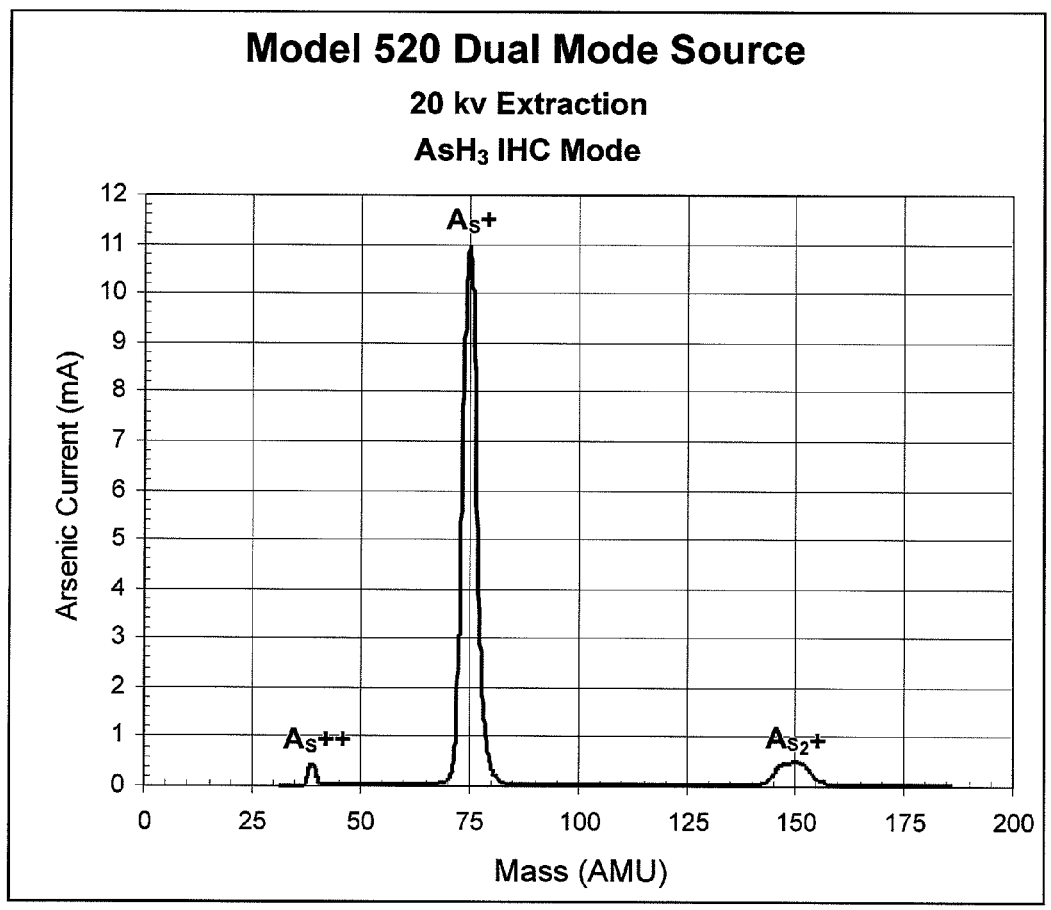
FIG. 22 is an $AsH_3$ mass spectrum collected from the ion source of the present invention.

FIG. 22 is an $AsH_3$ mass spectrum collected from the ion source of the present invention, in arc discharge mode. Over 10 mA of $^{70}As^+$ current and about 0.5 mA of doubly ionized arsenic, as well as 0.5 mA of arsenic dimer was delivered to the Faraday of the implanter at 20 kV extraction voltage. This performance is comparable to many commercial Bernas-style ion sources used in ion implantation.

Figure 23:
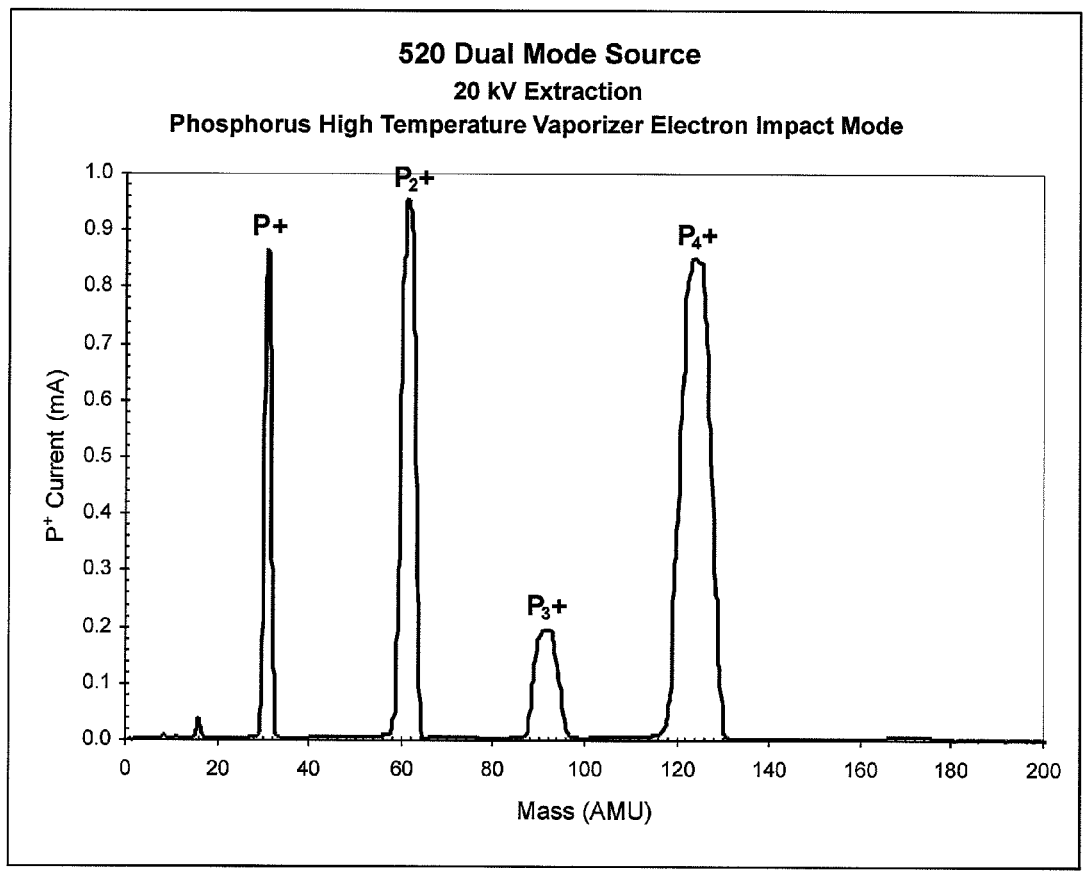
FIG. 23 is a P spectrum showing the monomer $P^+$, the dimer $P_2^+$, the trimer $P_3^+$, and the tetramer $P_4^+$.

FIG. 23 is a phosphorus spectrum showing the monomer $P^+$, the dimer $P_2^+$, the trimer $P_3^+$, and the tetramer $P_4^+$, produced in electron impact mode. The spectrum is unusual in that the monomer, dimer, and tetramer peaks are all about the same height (about 0.9 mA), so that the tetramer yields the highest dose rate, or about 3.6 mA of effective phosphorus atom current. The spectrum was produced using elemental P vapors from the hot vaporizer of the dual mode source. The high cluster yield is due to the fact that the P vapor preferentially produces $P_4$, and this fragile cluster is preserved during the ionization process by electron-impact ionization without exposing the vapors to intense radiation or heat.

Figure 24:
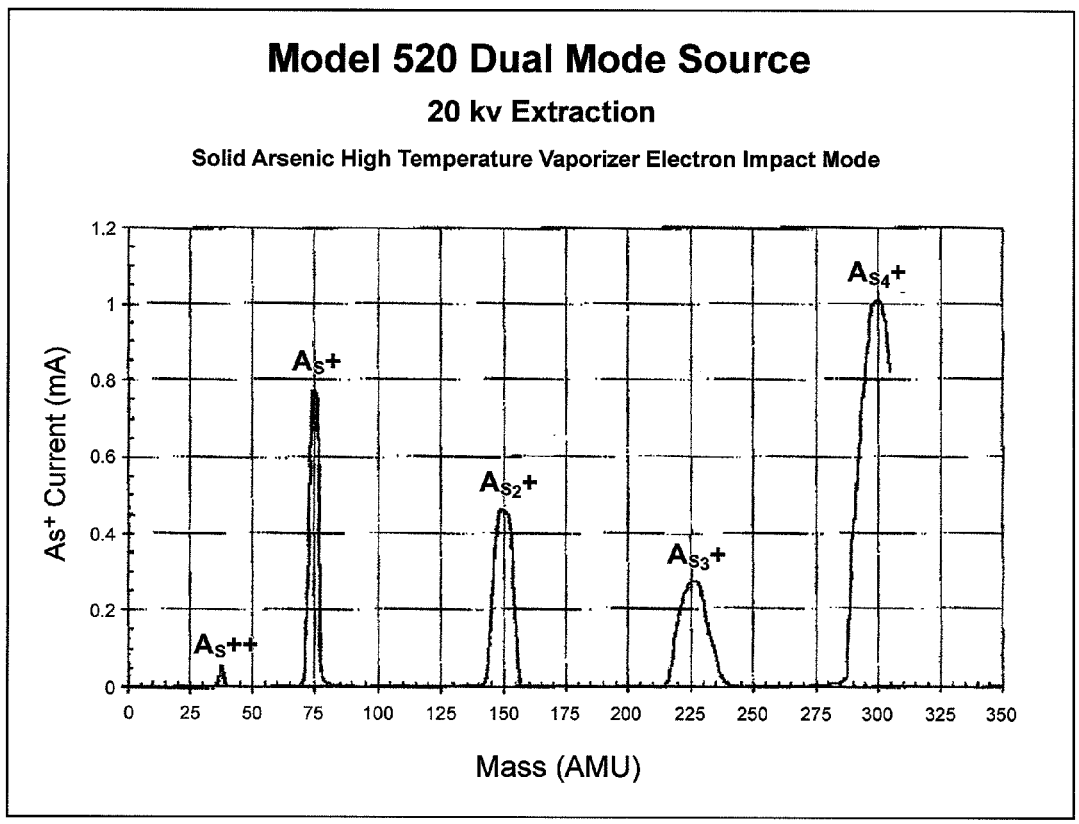
FIG. 24 is a As spectrum showing the monomer $As^+$, the dimer $As_2^+$, the trimer $As_3^+$, and the tetramer $As_4^+$.

FIG. 24 is similar to FIG. 23, but collected with elemental As vapors produced by the hot vaporizer of the dual-mode source. The As spectrum shows the monomer $^{70}As^+$, the dimer $As_2^+$, the trimer $As_3^+$, and the tetramer $As_4^+$. At 20 kV extraction, the equivalent of 4 mA of 5 keV $As^+$ is delivered to the Faraday.

Obviously, many modifications and variations of the present invention are possible in light of the above teachings. Thus, it is to be understood that, within the scope of the appended claims, the invention may be practiced otherwise than is specifically described above.

What is claimed and desired to be covered by a Letters Patent is as follows:

1. A universal ion source comprising:
   an ionization volume for receiving a gas or vapor and formed with an ion extraction aperture which enables an ion beam to be extracted from said ionization volume;
   a first electron source for emitting electrons in said ionization volume forming a plasma in order to ionize said gas or vapor in said ionization volume by arc discharge in a first mode of operation;
   a second electron source for emitting electrons in said ionization volume and ionizing said gas or vapor in said ionization volume by direct electron impact in a second mode of operation;
   a source of gas or vapor and wherein said source of gas or vapor includes a first vaporizer for receiving a solid material and generating a first vapor, wherein said first vaporizer is in fluid communication with said ionization volume in the first mode of operation, wherein said first vaporizer operates in the range of about 400° C. to about 550° C. and
   a control system for switching between said first mode of operation and said second mode of operation.

2. The universal ion source as recited in claim 1, wherein said second source of electrons is disposed external to said ionization volume.

3. The universal ion source as recited in claim 2, wherein said second electron source includes a filament.

4. The universal ion source as recited in claim 3, further including a magnetic dipole disposed adjacent to said filament for bending said electron beam 90°.

5. The universal ion source as recited in claim 1, wherein said first vaporizer is a hot vaporizer.

6. The universal ion source as recited in claim 1, wherein said source of gas or vapor includes a second vaporizer for receiving a solid material and generating a first vapor, wherein said second vaporizer is in fluid communication with said ionization volume in a second mode of operation.

7. The universal ion source as recited in claim 6, wherein said second vaporizer is a cold vaporizer.

8. The universal ion source as recited in claim 1, wherein said first vaporizer operates in the range of about 20° C. to about 120° C.

9. The universal ion source as recited in claim 1, further including an anticathode aligned with said first electron source.

10. The universal ion source as recited in claim 9, further including a source of a magnetic field oriented parallel to a line joining said first electron source and said anticathode defining a reflex geometry.

11. The universal ion source as recited in claim 10, wherein said source of a magnetic field includes a magnetic yoke assembly adjacent said ionization volume.

12. The universal ion source as recited in claim 11, wherein said ionization volume is formed from multiple components.

13. The universal ion source as recited in claim 12, wherein said multiple components include a base block, a cathode block and an ionization liner and together with said magnetic yoke assembly form said ionization volume.

14. The universal ion source as recited in claim 13, further including a source block in thermal communication with said base block.

15. The universal ion source as recited in claim 14, further including a temperature control system for controlling the temperature of said source block.

16. The universal ion source as recited in claim 1, wherein said first electron source is an indirectly heated cathode.

17. The universal ion source as recited in claim 1, wherein said second electron source includes an electron gun.

18. A universal ion source comprising:
    a first source of feed gas or vapor;
    a second source of feed gas or vapor;

an ion source for receiving said first source of feed gas or vapor and generating atomic ions from said first source of feed gas or vapor in a first mode of operation and receiving said second source of feed gas or vapor and generating molecular ions from said second source of feed gas or vapor in a second mode of operation, wherein said first mode of operation is an arc wherein said second mode of operation is a direct electron impact mode, wherein said first source of feed gas or vapor includes a first vaporizer for receiving a first solid source material and generating a first vapor, wherein said source of feed gas or vapor includes a second vaporizer for receiving a second solid source material and generating a second vapor, wherein said first vaporizer operates in the range of about 400° C. about 550°, wherein said second vaporizer operates in the range of about 20° C. to about 120° C.

19. The universal ion source as recited in claim 18 wherein one of said first said source of feed gas or said second source of feed gas includes one or more hot vaporizers configured to operate in the range of about 400° C. to about 550° C.

20. The universal ion source as recited in claim 18 wherein one of said first source of feed gas or said second source of feed gas includes one or more cold vaporizers configured to operate in the range of about 20° C. to about 120° C.

21. The universal ion source as recited in claim 18, wherein said ions are generated in an ionization volume at least partially enclosed by a liner.

22. The universal ion source as recited in claim 18, wherein the temperature of said liner is maintained at a temperature lower than said relatively high temperature.

* * * * *